(12) United States Patent
Poulin

(10) Patent No.: US 10,691,579 B2
(45) Date of Patent: Jun. 23, 2020

(54) SYSTEMS INCLUDING DEVICE AND NETWORK SIMULATION FOR MOBILE APPLICATION DEVELOPMENT

(71) Applicant: Wapp Tech Corp., Red Deer (CA)

(72) Inventor: Donavan P. Poulin, Kelowna (CA)

(73) Assignee: WAPP TECH CORP., Alberta (CA)

( * ) Notice: Subject to any disclaimer, the term of this patent is extended or adjusted under 35 U.S.C. 154(b) by 0 days.

(21) Appl. No.: 15/083,186

(22) Filed: Mar. 28, 2016

(65) Prior Publication Data

US 2016/0314060 A1 Oct. 27, 2016

Related U.S. Application Data

(60) Division of application No. 14/084,321, filed on Nov. 19, 2013, now Pat. No. 9,298,864, which is a division of application No. 12/705,913, filed on Feb. 15, 2010, now Pat. No. 8,589,140, which is a continuation-in-part of application No. 11/449,958, filed on Jun. 9, 2006, now Pat. No. 7,813,910.

(60) Provisional application No. 61/152,934, filed on Feb. 16, 2009, provisional application No. 60/689,101, filed on Jun. 10, 2005.

(51) Int. Cl.
| | |
|---|---|
| G06F 9/455 | (2018.01) |
| G06F 11/36 | (2006.01) |
| G06F 8/71 | (2018.01) |
| G06F 11/34 | (2006.01) |
| G06F 30/33 | (2020.01) |
| G06F 8/30 | (2018.01) |

(52) U.S. Cl.
CPC ............ *G06F 11/3664* (2013.01); *G06F 8/30* (2013.01); *G06F 8/71* (2013.01); *G06F 11/3457* (2013.01); *G06F 11/3668* (2013.01); *G06F 30/33* (2020.01); *G06F 9/455* (2013.01); *G06F 2201/86* (2013.01)

(58) Field of Classification Search
USPC ...................... 703/2, 13, 22, 24, 27; 709/246
See application file for complete search history.

(56) References Cited

U.S. PATENT DOCUMENTS

| | | | |
|---|---|---|---|
| 5,892,794 | A | 4/1999 | Slegers |
| 5,937,421 | A | 8/1999 | Petrov et al. |
| 6,389,384 | B1 | 5/2002 | Hampshire et al. |

(Continued)

FOREIGN PATENT DOCUMENTS

| | | |
|---|---|---|
| GB | 2398456 | 8/2004 |
| GB | 2398457 | 8/2004 |

(Continued)

OTHER PUBLICATIONS

"A Simple MIDP Application", http://dsc.sun.com/mobility/midp/chapters/j2mewhite/chap04.pdf, Developing MI DP Applications, Chapter 4, Mar. 2002.

(Continued)

*Primary Examiner* — Thai Q Phan
(74) *Attorney, Agent, or Firm* — Sheridan Ross P.C.

(57) ABSTRACT

A system, method and software product emulate and profile an application playing on a mobile device. The mobile device is emulated using a model based upon characteristics related to performance of the mobile device. The application is played and monitored within the model to determine resource utilization of the application for the mobile device.

36 Claims, 23 Drawing Sheets

(56) References Cited

U.S. PATENT DOCUMENTS

| | | |
|---|---|---|
| 6,393,437 B1 | 5/2002 | Zinda et al. |
| 6,467,052 B1 | 10/2002 | Kaler et al. |
| 6,477,483 B1 | 11/2002 | Scarlat et al. |
| 6,560,564 B2 | 5/2003 | Scarlat et al. |
| 6,708,293 B2 | 3/2004 | Kaler et al. |
| 6,802,058 B2 | 10/2004 | Banavar et al. |
| 7,047,176 B2 | 5/2006 | Klevans et al. |
| 7,107,049 B2 | 9/2006 | Baberis et al. |
| 7,313,772 B2 | 12/2007 | Hekmatpour et al. |
| 7,339,891 B2 | 3/2008 | Binder et al. |
| 7,508,868 B2 | 3/2009 | Chang |
| 7,529,990 B2 | 5/2009 | Haggerty |
| 7,546,298 B2 | 6/2009 | Poulin |
| 7,613,453 B2 | 11/2009 | Hassan et al. |
| 7,647,399 B2 | 1/2010 | Ofel |
| 7,673,042 B2 | 3/2010 | Lesser |
| 7,757,207 B2 | 7/2010 | Yan et al. |
| 7,783,463 B2 | 8/2010 | Herro |
| 7,813,910 B1 | 10/2010 | Poulin |
| 7,877,230 B2 | 1/2011 | Ofel et al. |
| 7,877,247 B2 | 1/2011 | Nahata et al. |
| 8,086,904 B2 | 12/2011 | Goldstein et al. |
| 8,108,201 B2 | 1/2012 | Ragnunath et al. |
| 8,116,179 B2 | 2/2012 | Lewallen et al. |
| 8,229,416 B2 * | 7/2012 | Akman ................ H04L 43/50 455/419 |
| 8,255,876 B2 | 8/2012 | Drukman et al. |
| 8,332,203 B1 | 12/2012 | Poulin |
| 8,738,761 B2 | 5/2014 | Raisoni et al. |
| 8,924,192 B1 | 12/2014 | Poulin |
| 9,158,518 B2 | 10/2015 | Brown et al. |
| 9,298,864 B2 | 3/2016 | Poulin |
| 9,971,678 B2 | 5/2018 | Poulin |
| 2001/0041973 A1 | 11/2001 | Abkowitz et al. |
| 2002/0015387 A1 | 2/2002 | Houh |
| 2002/0059054 A1 | 5/2002 | Bade et al. |
| 2002/0077823 A1 | 6/2002 | Fox et al. |
| 2002/0169591 A1 | 11/2002 | Ryzl |
| 2002/0188713 A1 | 12/2002 | Bloch et al. |
| 2003/0045298 A1 | 3/2003 | Linton et al. |
| 2003/0139180 A1 * | 7/2003 | McIntosh ............ H04L 63/0853 455/426.1 |
| 2003/0156549 A1 | 8/2003 | Binder et al. |
| 2003/0163382 A1 | 8/2003 | Stefanik et al. |
| 2003/0236657 A1 | 12/2003 | Ryzl |
| 2004/0039975 A1 | 2/2004 | Kounik et al. |
| 2004/0040010 A1 | 2/2004 | Kounik et al. |
| 2004/0059562 A1 | 3/2004 | Bergman et al. |
| 2004/0097237 A1 | 5/2004 | Aoyama |
| 2004/0122645 A1 | 6/2004 | Shevenell et al. |
| 2004/0128585 A1 | 7/2004 | Hind et al. |
| 2004/0154016 A1 | 8/2004 | Randall |
| 2005/0090239 A1 * | 4/2005 | Lee ................ H04M 1/72525 455/418 |
| 2005/0090243 A1 | 4/2005 | El Husseini et al. |
| 2005/0125211 A1 | 6/2005 | Nahata et al. |
| 2005/0182611 A1 | 8/2005 | Sakamoto |
| 2006/0009157 A1 | 1/2006 | Chiu |
| 2006/0036941 A1 | 2/2006 | Neil |
| 2006/0037002 A1 | 2/2006 | Vinberg et al. |
| 2006/0041858 A1 | 2/2006 | Yan et al. |
| 2006/0090136 A1 | 4/2006 | Miller |
| 2006/0136191 A1 | 6/2006 | Irons |
| 2006/0140125 A1 | 6/2006 | Ottinger et al. |
| 2006/0205398 A1 | 9/2006 | Seckendorf et al. |
| 2006/0223522 A1 | 10/2006 | Guo et al. |
| 2006/0239198 A1 | 10/2006 | Mlinarsky et al. |
| 2006/0277231 A1 | 12/2006 | Kral et al. |
| 2006/0282247 A1 | 12/2006 | Brennan et al. |
| 2007/0002753 A1 | 1/2007 | Bailey |
| 2007/0005324 A1 | 1/2007 | Gong et al. |
| 2007/0019769 A1 | 1/2007 | Green et al. |
| 2007/0127426 A1 | 6/2007 | Watters et al. |
| 2007/0142091 A1 | 6/2007 | Gasborro et al. |
| 2007/0174490 A1 | 7/2007 | Choi et al. |
| 2007/0288424 A1 | 12/2007 | Neil |
| 2008/0313282 A1 | 12/2008 | Warila et al. |
| 2009/0157811 A1 | 6/2009 | Bailor et al. |
| 2009/0254330 A1 | 10/2009 | Goria |
| 2010/0017185 A1 | 1/2010 | Bade et al. |
| 2010/0075678 A1 * | 3/2010 | Akman ................ H04W 24/06 455/436 |
| 2012/0129503 A1 | 5/2012 | Lindeman et al. |
| 2018/0260315 A1 | 9/2018 | Poulin |

FOREIGN PATENT DOCUMENTS

| | | |
|---|---|---|
| WO | WO 99/63439 | 12/1999 |
| WO | WO 2005/053341 | 6/2005 |
| WO | WO 2006/089386 | 8/2006 |

OTHER PUBLICATIONS

"Achieving Effective QoE in Networked Application and Infrastructure Before Deployment with Shunra's 'Virtual Enterprise'," Enterprise Management Associates, Mar. 2005, 6 pages.

"Agreement and Plan of Merger," Hewlett Packard Enterprise Company, Sep. 7, 2016, 121 pages.

"BlackBerry Java Development Environment Version 3.6," Research in Motion, Mar. 21, 2003, 248 pages.

"BlackBerry Simulator Version 3.6," Research in Motion, Apr. 10, 2003, 28 pages.

"Corporate Backgrounder," Shunra, Date Unknown, 2 pages.

"Creating a BREW Application from Scratch in Visual Studio 2005," Qualcomm, Apr. 28, 2006, 10 pages.

"Creating a BREW Application from Scratch," Qualcomm, Oct. 23, 2002, 49 pages.

"Creating BREW Applications Using Visual Studio .NET," Qualcomm, Mar. 11, 2003, 16 pages.

"Data Sheet: LoadRunner," Micro Focus, 2018, 5 pages.

"Dtrace User Guide," Sun Microsystems, 2006, 44 pages.

"EEMBC Benchmarks for the Java 2 Micro Edition J2ME Platform," EEMBC, May 2003, 5 pages.

"EPOC Emulator," Symbian, 1997, 14 pages.

"Getting Started", Openwave Systems, Inc, Jun. 2002, 24 pages.

"HP LoadRunner and HP Performance Center with Shunra Network Virtualization," Hewlett Packard Enterprise Company, Oct. 2013, 4 pages.

"HP Network Virtualization for Mobile," Hewlett Packard Enterprise Company, Mar. 2014, 4 pages.

"Interim Financial Statements for the Period from May 1, 2017 to Aug. 21, 2018," Micro Focus International PLC, 2018, 10 pages.

"J2ME Programming/MIDP Device Databases," Wikibooks, Apr. 28, 2010, 3 pages.

"Java Application Profiling using TPTP," International Business Machines Corp., Jul. 11, 2006, 12 pages.

"JBenchmark Homepage," JBenchmark, Feb. 10, 2005, 1 page.

"JBenchmark Mobile Java (J2ME) Performance Tools," JBenchmark, Feb. 5, 2005, 1 page.

"Macromedia FlashCast FAQ," 2006, 4 Pages.

"Mercury LoadRunner Tutorial, Version 8.1," Mercury, 2004, 137 pages.

"Microfocus International PLC Interim Results for the Six Months Ended Apr. 30, 2018," Micro Focus, Jul. 11, 2018, 52 pages.

"Microfocus International PLC Interim Results for the Six Months Ended Oct. 31, 2017," Micro Focus, Jan. 8, 2018, 68 pages.

"Motorola SDK iDEN Development and Runtime Utilities," Motorola, 2005, 106 pages.

"Native and Hybrid App Support," Micro Focus, Aug. 29, 2018, 5 pages.

"NetBeans IDE 4.1," NetBeans, May 2005, 49 pages.

"Network Computing Magazine Tests with Shunra Software's Preemptive Infrastructure Permancne Management Solutions," Business Wire, Apr. 28, 2003, 2 pages.

"Press Release: Mercury Announces Mercury Performance Center 8.1," Mercury, Oct. 10, 2005, 2 pages.

"Product Briefs," ADT Mag, Jun. 1, 2004, 6 pages.

(56) References Cited

OTHER PUBLICATIONS

"Professional Flash Lite User Manual, 2nd Edition," Macromedia, Aug. 2003, 22 Pages.
"Record Scripts," Micro Focus, Aug. 29, 2018, 6 pages.
"*Seattle Spinco, Inc. and Entit Software LLC*, v. *Wapp Tech Limited Partnership and Wapp Tech Corp.*, Complaint for Declaratory Judgment," United States District Court for the District of Delaware, Oct. 15, 2018, 34 pages.
"Series 60 Developer Platform: Debugging Software with Borland C++BuilderX," Nokia, Jan. 12, 2004, 27 pages.
"Shunra Network Tools and Sony Playstation 2," TMCNet, Jul. 28, 2004, 6 pages.
"Starting with BREW," Qualcomm, Apr. 27, 2004, 86 pages.
"StormRunner Load Help Center," Micro Focus, Feb. 1, 2018, 2 pages.
"The Network Connection", http://dsc.sun.com/mobility/midp/chapters/j2mewhite/chap13.pdf, The Generic Connection Framework, Chapter 13, Mar. 2002.
"The Shunra Virtual Enterprise Product Family," Shunra, 2004, 2 pages.
"United States Securities and Exchange Commission Form 8-K," Hewlett Packard Enterprise Company, Sep. 7, 2016, 9 pages.
"Unprocessed JBenchmark 2 Results," Jbenchmark, Feb. 4, 2005, 3 pages.
"User's Guide: Wireless Toolkit, Version 2.1 Java 2 Platform, Micro Edition," Sun Microsystems, Dec. 2003, 122 pages.
"*Wapp Tech Limited Partnership and Wapp Tech Corp.*, v. *Bank of America Corp.*, Plaintiff's Opposition to Defendant's Motion to Stay," United States District Court for the Eastern District of Texas, Sherman Division, Oct. 31, 2018, 35 pages.
"*Wapp Tech Limited Partnership and Wapp Tech Corp.*, v. *Hewlett Packard Enterprise Co.*, Plaintiff's Opposition to Defendant's Motion to Stay," United States District Court for the Eastern District of Texas, Sherman Division, Nov. 1, 2018, 48 pages.
"*Wapp Tech Limited Partnership and Wapp Tech Corp.*, v. *Micro Focus International PLC*, Plaintiff's Opposition to Defendant's Motion to Dismiss," United States District Court for the Eastern District of Texas, Sherman Division, Oct. 31, 2018, 69 pages.
"*Wapp Tech Limited Partnership and Wapp Tech Corp.*, v. *Micro Focus International PLC*, Plaintiff's Original Complaint," United States District Court for the Eastern District of Texas, Sherman Division, Jul. 2, 2018, 29 pages.
"*Wapp Tech Limited Partnership and Wapp Tech Corp.*, v. *Wells Fargo & Company*, Plaintiff's Opposition to Defendant's Motion to Stay," United States District Court for the Eastern District of Texas, Sherman Division, Oct. 31, 2018, 24 pages.
"Windows CE Development, Testing, and Tuning," Compuware NuMega, Date Unknown, 8 pages.
"Working with Emulators," Micro Focus, Aug. 29, 2018, 4 pages.
Adobe, "MAX Sneak Peeks", MAX 2005 Articles, Oct. 2005, 12 Pages.
Adobe, "Unable to use a handset emulator to test Flash Lite content", Feb. 28, 2005, 1 page.
Adobe, FlashCast Add-in for Flash MX Professional 2004, 2009, 3 Pages.
Campbell, "Letter to Dr. TW Stevenson", Adobe Systems, Inc, Jan. 14, 2005, 2 Pages.
Compuware, "Windows CE Development, Testing and Tuning", Compuware NuMega, no date available.
De Herrera, "Windows Mobile 5.0 Emulator", Pocket PC FAQ, 2005, 9 pages.
Harrison, et al., "Appendix 4: Emulator Reference", Symbian OS for Mobile Phones, 2003, 15 pages.
Hewgill, "Copilot: Design and Development," Handheld Systems, May/Jun. 1998, 3 pages.
Kane Computing, LTD, , "Code Composer Studio Development Tools v3.1", Getting Started Guide, Texas Instruments, May 2005.
Kennedy, Storm STX-100 Box Profiles Your App Performance Under Variable Network Conditions, InfoWorld, Mar. 26, 2004, 5 pages.
Knudsen, "New Features in the J2ME Wireless Toolkit 1.0.4," Jun. 2002, 5 pages.
Li et al., "Beginning J2ME: From Novice to Professional, Third Edition," 2005, Apress, Berkeley, CA, 47 pages.
Lorimer, "Get Started Profiling Applications in Eclipse," EclipseZone, Oct. 13, 2005, 16 pages.
Maas, , "Using Palm OS Emulator", PalmSource, Mar. 2002, 238 pages.
Moore, "Wireless Apps Require Vigilant Monitoring," ComputerWorld, Aug. 18, 2000, 2 pages.
Morrison, "Day 3: Wireless Java with J2ME", InformIT, Jun. 17, 2001, 23 pages.
Morrison, "Getting to Know the J2ME Emulator", J2ME Emulator Essentials, Aug. 17, 2001.
Motorola, "iDEN Development and Runtime Utilities", Motorola, 2005.
Musich, "Shunras Network Modeling Tool Replicates WANs," eWeek, Apr. 28, 2005, 4 pages.
Nokia, "Release Note for Nokia's Series 60", Release Note for Nokia's Series 60, 2nd Edition SOK for Symbian OS Supporting Feature Pack 3, Jun. 17, 2005, 5 Pages.
NTT Docomo, "Flash Lite Authoring Guidelines for the i-mode Service", MX Professional 2004, 1st Edition, Mar. 2003, 48 Pages.
Pratschner, "Analyzing Device Application Performance with the .Net Compact Framework Remote Performance Monitor," Microsoft Developer, Apr. 17, 2005, 8 pages.
Rollin, "Palm OS Emulator 2.1/3.0," Palm Computing, Jul. 24, 1998, 35 pages.
Rollin, "The Palm OS Emulator," Handheld Systems, May/Jun. 1998, 6 pages.
Sarkar et al., "A Review of Simulation of Telecommunication Networks: Simulators, Classification, Comparison, Methodologies, and Recommendations," Journal of Selected Areas in telecommunications, Mar. 2011, pp. 10-17.
Satoh, "A Testing Framework for Mobile Computing Software", IEEE Computer Society, IEEE Transactions on Software Engineering; vol. 29 No. 12, Dec. 2003.
Sharma et al., "Network Simulators for Next Generation Networks: An Overview," International Journal of Mobile Network Communications & Telematics, vol. 4, No. 4, Aug. 2014, pp. 39-51.
Snyder, "How we tested Symantec's Mail Security 8100 Series applicance," Network World, Apr. 11, 2005, 2 pages.
Stevenson, "Code Composer Studio IDE v3 White Paper", Jul. 2004.
Sun Java System, "J2EE 1.4 Platform", NetBeans, May 2005.
Sun Microsystems, "J2ME Wireless Toolkit", User's Guide, Version 2.2, Oct. 2004.
Sun Microsystems, "White Paper on KVM and the Connected, Limited Device Configuration (CLDC)", J2ME Building Blocks for Mobile Devices, May 19, 2000.
Symbian, "EPOC Emulator", 1997.
Talbot, "Creating Flash Lite Applications", Adobe, 2006, 38 Pages.
Taylor, "AgentJ: Enabling Java for NS-2 Simulations of Distributed Network Applications," 2nd International Conference on Distributed Frameworks for Multimedia Applications, May 2006, 6 pages.
Taylor, Michael "J2ME IDE Comparison", Development Consulting Limited Version 1.1, Jun. 29, 2002.
Texas Instruments, "Code Composer Studio v3.0", Getting Started Guide, Sep. 2004.
Texas Instruments, "Code Composer Studio v5", Texas Instruments Embedded Processors Wiki, No date available.
Thinkvillage-Kiwi LLC, "Complaint and Demand for Jury Trial", Case No. CV 08-4166 JL, Sep. 1, 08, 12 Pages.
Vaughan, "Brave New Performance Management World," ADT Mag, Jan. 1, 2004, 5 pages.
Weinberg, "Shunra's Storm is a hardware-based network modeling tool that does a great job on the WAN," NetworkWorld, Nov. 2, 2004, 3 pages.
Yi et al., "World Performance: Help Device Developers Build Better Applications," Java World, Oct. 25, 2002, 17 pages.
Yuan, "Developing J2ME Applications with EclipseME", IBM, Nov. 30, 2004, 41 pages.

(56) References Cited

OTHER PUBLICATIONS

Official Action for U.S. Appl. No. 14/581,475, dated May 17, 2017, 12 pages.
Notice of Allowance for U.S. Appl. No. 14/581,475, dated Jan. 11, 2018, 5 pages.
Official Action for U.S. Appl. No. 13/673,692, dated Nov. 6, 2013, 6 pages.
Notice of Allowance for U.S. Appl. No. 13/673,692, dated Jul. 17, 2014, 5 pages.
Official Action for U.S. Appl. No. 12/759,543, dated Mar. 15, 2012, 7 pages.
Notice of Allowance for U.S. Appl. No. 12/759,543, dated Sep. 6, 2012, 5 pages.
Official Action for U.S. Appl. No. 11/449,958, dated Jun. 1, 2009, 10 pages.
Official Action for U.S. Appl. No. 11/449,958, dated Aug. 26, 2009, 10 pages.
Official Action for U.S. Appl. No. 11/449,958, dated Nov. 17, 2009, 11 pages.
Official Action for U.S. Appl. No. 11/449,958, dated Dec. 3, 2009, 11 pages.
Official Action for U.S. Appl. No. 11/449,958, dated Apr. 19, 2010, 11 pages.
Notice of Allowance for U.S. Appl. No. 11/449,958, dated Aug. 16, 2010, 4 pages.
Official Action for U.S. Appl. No. 15/979,330, dated Oct. 5, 2018, 9 pages.
"A Million Users in a Box: The WTS Story," Mobile Systems Verification Corporation, Date Unknown, 13 pages.
"About Mobile Systems Verification," Mobile Systems Verification Corporation, Feb. 11, 2002, 1 page.
"About MTS Tester Edition," mVerify Corporation, 2007, 2 pages.
"AppTest," Digia, Inc., 2003, retrieved from https://web.archive.org/web/20030610173449/http://digia.com:80/digia/devhome.nsf/pages/AppTest, 2 pages.
"Function: Getramfree()," Qualcommm Technologies Inc., 2010, retrieved from https://developer.brewmp.com/reference/api/brew-mp-102/function-getramfree, 2 pages.
"Gate II/MATE Overview," Ericsson Radio Systems, Date Unknown. 34 pages.
"Hotwire.com Selects Shunra Software to Proactively Ensure the Performance of its eCommerce Applications Over the Internet," Shunra Software Ltd., Nov. 8, 2004, retrieved from https://web.archive.org/web/20050405232409/http://www.shunra.com.newsroom/release/releaseDetail.php?r=38, 2 pages.
"How Shunra\Storm Works," Shunra Software Ltd., 2004, retrieved from https://web.archive.org/web/20040428035846/http://www.shunra.com:80/products/storm_sub/storm_2.php, 3 pages.
"IHEAP_GETMEMSTATS()," Qualcommm Technologies Inc., 2010, retrieved from https://developer.brewmp.com/reference/api/brew-mp-102/iheapgetmemstats, 2 pages.
"ISHELL_GETDEVICEINFO()," Qualcomm Technologies Inc., 2010, retrieved from https://developer.brewmp.com/reference/api/brew-mp-102/ishellgetdeviceinfo, 2 pages.
"Launch Configuration Settings," EclipseME, 2005, retrieved from https://web.archive.org/web/20050225034344/http://eclipseme.org/docs/refLaunchConfig.html, 4 pages.
"LG200 3G Load Generator," UbiNetics, 2002, retrieved from https://web.archive.org/web/20040224010205/http://www.ubinetics.com:80/product/product.asp?t ab=1&intld=14&s=S, 3 pages.
"Mate User Manual," Ericsson Radio Systems, 2001, 13 pages.
"Mercury LoadRunner—Features and Benefits," Mercury Interactive Corporation, 2004, retrieved from https://web.archive.org/web/20040529014436/http://www.mercury.com:80/us/products/performance-center/loadrunner/features.html, 1 page.
"Mercury LoadRunner—How It Works," Mercury Interactive Corporation, 2004, retrieved from https://web.archive.org/web/20040615191333/http://www.mercury.com/us/products/performance-center/loadrunnertworks.html, 1 page.
"MTS Road Map," mVerify Corporation, Sep. 8, 2006, 7 pages.
"MTS/LGS Logistics Solution," mVerify Corporation, 2006, 1 page.
"mVerify Solutions," mVerify Corporation, 2008, 3 pages.
"Nokia Developer's Suite for the Java 2 Platform, Micro Edition, Version 3.0 for Windows, User's Guide," Apr. 26, 2005, 105 pages.
"NXM Airlink Emulator," mVerify Corporation, Oct. 3, 2003, 5 pages.
"PacketStorm1800E/2600E IP Network Emulator," PacketStorm, Web Archive Dated Jun. 13, 2001, retrieved from https://web.archive.org/web/20010613092608/http:/www.packetstorm.com:80/PacketStorm1800E.pdf, 39 pages.
"Products: Mercury LoadRunner for Automated Load Testing," Mercury Interactive Corporation, 2004, retrieved from https://web.archive.org/web/20040529014849/http://www.mercury.com/us/products/performance-center/loadrunner/, 1 page.
"Shunra Software delivers pre-emptive Infrastructure Performance Management," Shunra Software Ltd., 2004, retrieved from https://web.archive.org/web/20040815083936/http://www.shunra.com/products/cloud/image_cloud1.php, 1 page.
"Shunra Stratus 2.0 Shortens Development Lifecycle," International Developer, Jul. 5, 2004, retrieved from https://web.archive.org/web/20040625071924/http://www.intldeveloper.co.uk/news/general+news/shunra+stratus+2.0+shortens+development+lifecycl, 2 pages.
"Shunra Virtual Enterprise 4.0—Deliver It with Confidence," Shunra Software Ltd., 2006, 6 pages.
"Shunra\Cloud: Network Emulator for the Small Business Performance Lab," Shunra Software Ltd., 2004, retrieved from https://web.archive.org/web/20040603034347/http://www.shunra.com/products/cloud/cloud_1.php, 2 pages.
"Shunra\Storm Solution Suite: The Complete Enterprise Performance Lab," Shunra Software Ltd., 2004, retrieved from https://web.archive.org/web/20040220110254/http://www.shunra.com:80/products/storm/storm_1.php, 4 pages.
"Shunra\Storm: Bringing the Complete Enterprise Environment into Your Lab," Shunra Software Ltd., 2003, 7 pages.
"Shunra\Stratus 2.0 for Development Testing of Distributed Applications," Shunra Software Ltd., 2004, retrieved from https://web.archive.org/web/20040609052906/http://www.shunra.com/products/stratus/stratus_1.php, 3 pages.
"Shunra\Stratus: Performance Debugger for Distributed Applications," Shunra Software Ltd., 2004, retrieved from https://web.archive.org/web/20040405013310/http://www.shunra.com:80/products/stratus/stratus_1.php, 3 pages.
"Technology Briefing: Testing Complex Networks, Prepared for Lockheed-Martin," mVerify Corporation, Feb. 28, 2008, 25 pages.
"Testing Report: Shunra\Storm STX-100," CT Labs Testing Services, Oct. 2003, 9 pages.
"The Shunra Virtual Enterprise Architecture and Specifications," Shunra Software Ltd., 2004, retrieved from https://web.archive.org/web/20050403171105/http://www.shunra.com/products/Architecture.php, 4 pages.
"The Shunra Virtual Network (Desktop Edition)," Shunra Software Ltd., 2004, retrieved from https://web.archive.org/web/20050205135902/http://www.shunra.com/products/VirtualNetworkDesktop.php, 3 pages.
"The Shunra Virtual Network: Assess IT Services Over a Network Link," Shunra Software Ltd., Web Archive dated Mar. 7, 2005, 2 pages.
"Using the Brew MP 1.0.2 API Reference," Brew, 2019, retrieved from brewmp.com, 3932 pages. Submitted in Seven Parts.
"*Wapp Tech Limited Partnership and Wapp Tech Corp.*, v. *Bank of America Corp.*, Defendant's P.R. 3-3 Invalidity Contentions," United States District Court for the Eastern District of Texas, Sherman Division, Dec. 20, 2019, 43 pages.
"*Wapp Tech Limited Partnership and Wapp Tech Corp.*, v. *Bank of America Corp.*, Defendant's P.R. 3-3 invalidity Contentions: Appendix A," United States District Court for the Eastern District of Texas, Sherman Division, Dec. 20, 2019, 84 pages.
"*Wapp Tech Limited Partnership and Wapp Tech Corp.*, v. *Bank of America Corp.*, Defendant's P.R. 3-3 Invalidity Contentions: Appendix B-1," United States District Court for the Eastern District of Texas, Sherman Division, Dec. 20, 2019, 1372 pages.
"*Wapp Tech Limited Partnership and Wapp Tech Corp.*, v. *Bank of America Corp.*, Defendant's P.R. 3-3 Invalidity Contentions: Appen-

(56) References Cited

OTHER PUBLICATIONS dix B-2," United States District Court for the Eastern District of Texas, Sherman Division, Dec. 20, 2019, 1917 pages.
"*Wapp Tech Limited Partnership and Wapp Tech Corp.*, v. *Bank of America Corp.*, Defendant's P.R. 3-3 Invalidity Contentions: Appendix B-3," United States District Court for the Eastern District of Texas, Sherman Division, Dec. 20, 2019, 1924 pages.
"*Wapp Tech Limited Partnership and Wapp Tech Corp.*, v. *Bank of America Corp.*, Defendant's P.R. 3-3 Invalidity Contentions: Appendix B-4," United States District Court for the Eastern District of Texas, Sherman Division, Dec. 20, 2019, 1993 pages.
"*Wapp Tech Limited Partnership and Wapp Tech Corp.*, v. *Bank of America Corp.*, Defendant's P.R. 3-3 Invalidity Contentions: Appendix B-5," United States District Court for the Eastern District of Texas, Sherman Division, Dec. 20, 2019, 491 pages.
"*Wapp Tech Limited Partnership and Wapp Tech Corp.*, v. *Bank of America Corp.*, Defendant's P.R. 3-3 Invalidity Contentions: Appendix C," United States District Court for the Eastern District of Texas, Sherman Division, Dec. 20, 2019, 11 pages.
"*Wapp Tech Limited Partnership and Wapp Tech Corp.*, v. *Seattle Spinco, Inc., et al.*, Defendants' P.R. 3-3- Invalidity Contentions," United States District Court for the Eastern District of Texas, Sherman Division, Dec. 20, 2019, 43 pages.
"*Wapp Tech Limited Partnership and Wapp Tech Corp.*, v. *Seattle Spinco, Inc., et al.*, Defendants' P.R. 3-3- Invalidity Contentions: Appendix A," United States District Court for the Eastern District of Texas, Sherman Division, Dec. 20, 2019, 84 pages.
"*Wapp Tech Limited Partnership and Wapp Tech Corp.*, v. *Seattle Spinco, Inc., et al.*, Defendants' P.R. 3-3- Invalidity Contentions: Appendix B-1," United States District Court for the Eastern District of Texas, Sherman Division, Dec. 20, 2019, 1372 pages.
"*Wapp Tech Limited Partnership and Wapp Tech Corp.*, v. *Seattle Spinco, Inc., et al.*, Defendants' P.R. 3-3- Invalidity Contentions: Appendix B-2," United States District Court for the Eastern District of Texas, Sherman Division, Dec. 20, 2019, 1917 pages.
"*Wapp Tech Limited Partnership and Wapp Tech Corp.*, v. *Seattle Spinco, Inc., et al.*, Defendants' P.R. 3-3- Invalidity Contentions: Appendix B-3," United States District Court for the Eastern District of Texas, Sherman Division, Dec. 20, 2019, 1924 pages.
"*Wapp Tech Limited Partnership and Wapp Tech Corp.*, v. *Seattle Spinco, Inc., et al.*, Defendants' P.R. 3-3- Invalidity Contentions: Appendix B-5," United States District Court for the Eastern District of Texas, Sherman Division, Dec. 20, 2019, 491 pages.
"*Wapp Tech Limited Partnership and Wapp Tech Corp.*, v. *Seattle Spinco, Inc., et al.*, Defendants' P.R. 3-3- Invalidity Contentions: Appendix C," United States District Court for the Eastern District of Texas, Sherman Division, Dec. 20, 2019, 11 pages.
"*Wapp Tech Limited Partnership and Wapp Tech Corp.*, v. *Wells Fargo & Company*, Defendant's P.R. 3-3 Invalidity Contentions," United States District Court for the Eastern District of Texas, Sherman Division, Dec. 20, 2019, 43 pages.
"*Wapp Tech Limited Partnership and Wapp Tech Corp.*, v. *Wells Fargo & Company*, Defendants' P.R. 3-3- Invalidity Contentions: Appendix A," United States District Court for the Eastern District of Texas, Sherman Division, Dec. 20, 2019, 84 pages.
"*Wapp Tech Limited Partnership and Wapp Tech Corp.*, v. *Wells Fargo & Company*, Defendants' P.R. 3-3- Invalidity Contentions: Appendix B-1," United States District Court for the Eastern District of Texas, Sherman Division, Dec. 20, 2019, 1372 pages.
"*Wapp Tech Limited Partnership and Wapp Tech Corp.*, v. *Wells Fargo & Company*, Defendants' P.R. 3-3- Invalidity Contentions: Appendix B-2," United States District Court for the Eastern District of Texas, Sherman Division, Dec. 20, 2019, 1917 pages.
"*Wapp Tech Limited Partnership and Wapp Tech Corp.*, v. *Wells Fargo & Company*, Defendants' P.R. 3-3- Invalidity Contentions: Appendix B-3," United States District Court for the Eastern District of Texas, Sherman Division, Dec. 20, 2019, 1924 pages.
"*Wapp Tech Limited Partnership and Wapp Tech Corp.*, v. *Wells Fargo & Company*, Defendants' P.R. 3-3- Invalidity Contentions: Appendix B-4," United States District Court for the Eastern District of Texas, Sherman Division, Dec. 20, 2019, 1993 pages.
"*Wapp Tech Limited Partnership and Wapp Tech Corp.*, v. *Wells Fargo & Company*, Defendants' P.R. 3-3- Invalidity Contentions: Appendix B-5," United States District Court for the Eastern District of Texas, Sherman Division, Dec. 20, 2019, 491 pages.
"*Wapp Tech Limited Partnership and Wapp Tech Corp.*, v. *Wells Fargo & Company*, Defendants' P.R. 3-3- Invalidity Contentions: Appendix C," United States District Court for the Eastern District of Texas, Sherman Division, Dec. 20, 2019, 11 pages.
"*Wapp Tech Limited Partnership and Wapp Tech Corp.*, v. *Wells Fargo & Company*, Defendants' P.R. 3-3- Invalidity Contentions: Exhibits 1-28," United States District Court for the Eastern District of Texas, Sherman Division, Dec. 20, 2019, 4550 pages. Submitted in Ten Parts.
"Wind River Workbench Product Note," Wind River, Web Archive Dated Jan. 31, 2005, retrieved from https://web.archive.org/web/20050131042600/http:/www.windriver.com/products/development_tools/ide/wind_river_workbench/wr_workbench-pn.pdf, 22 pages.
Andersson, "Chapter 14: Testing the Wireless Applications," in "GPRS and 3G Wireless Applications: Professional Developers Guide, "John Wiley & Sons, Inc., New York, NY, 2001.
Andersson, "Mobile Internet—An industry-wide paradigm shift," Ericsson Review, No. 4, 1999, pp. 206-213.
Avvenuti et al., "Internet Emulation for Java Applications through Socket Factories," Proceedings of the 26th Annual International Computer Software and Applications Conference, 2002, 6 pages.
Binder et al., "Mobile Systems Verification Corporation Investor Presentation," Arch Venture Partners, Jan. 17, 2002, 48 pages.
Binder et al., "The Advanced Mobile Application Testing Environment," Mobile Systems Verification Corporation, 2003, 29 pages.
Binder, "Chicago Start-up Previews Next Generation Wireless Testing," Mobile Systems Verification Corporation, 2002, 1 page.
Bourgois et al., "Necessity of an Emulator to Validate New Resources Allocation Protocols," Institute of Electrical and Electronics Engineers VTS 53rd Vehicular Technology Conference, May 2001, pp. 3049-3052.
Caporuscio et al., "An Experience in Evaluating Publish/Subscribe Services in a Wireless Network," WOSP '02: Proceedings of the 3rd International Workshop on Software and Performance, Jul. 2002, pp. 128-133.
Carson et al., "Nist Net—A Linux-based Network Emulation Tool," ACM SIGCOMM Computer Communications Review, vol. 33, No. 3, Jul. 2003, pp. 111-126.
Combee et al., "Chapter 7: Debugging Web Clipping Applications," in "Palm OS Web Application Developer's Guide," Syngress Publishing, Rockland, MA, 2001, pp. 1-2, 195-222.
Davies et al., "A Network Emulator to Support the Development of Adaptive Applications," Proceedings of 2nd USENIX Symposium on Mobile and Location Independent Computing, Ann Arbor, U.S., Apr. 1995, 9 pages.
Davies et al., "Evaluating a location-based application: a hybrid test and simulation environment" Pervasive Computing, Jul. 2004, pp. 48-56.
Drogseth et al., "Delivering WAN-ready applications with Shunra," Network World, Oct. 11, 2004, 4 pages.
Dubie, "Shunra updates network simulation, profiling tool," Network World, Feb. 9, 2006, 3 pages.
Gayraud et al., "Two-Stage Wireless Network Emulation," in "Broadband Satellite Comunication Systems and the Challenges of Mobility," IFIP TC6 Workshops on Broadband Satellite Communication Systems and Challenges of Mobility, World Computer Congress, Aug. 2004, pp. 181-190.
Hernandez et al., "Ramon: Rapid-Mobility Network Emulator," Proceedings of the 27th Annual IEEE Conference on Local Computer Networks, 2002, 9 pages.
Holland, "Wireless Network Emulation System (WiNE)," HRL Laboratories, LLC Mar. 30, 2005, 14 pages.
Jiang et al., "A Portable Real-time Emulator for Testing Multi-Radio MANETs," Proceedings of the 20th International Parallel and Distributed Processing Symposium, Apr. 2006, 18 pages.

(56) References Cited

OTHER PUBLICATIONS

Jin et al., "Designing and Implementing of a Wireless Network Emulator," Canadian Conference on Electrical and Computer Engineering, May 2004, 5 pages.
Kennedy, "Shunra unleashes an enterprise testing Storm," InfoWorld, Mar. 26, 2004, 5 pages.
Kenny et al., "Methods and Apparatus for Collecting and Reporting Performance Parameters for a Wireless Device," U.S. Appl. No. 60/665,293, dated Mar. 25, 2005, 21 pages.
Kojo et al., "Seawind: A Wireless Network Emulator," 2001 Aachen International Multiconference on Measurement, Modelling, and Evaluation of Computer-Communication Systems, Sep. 2001, 19 pages.
Kral et al., "An Integrated Software Development and Porting System for Wireless Devices," U.S. Appl. No. 60/688,243, dated Jun. 6, 2005, 40 pages.
Mahesh et al., "Device Pack and Version Specific Brew Simulation Libraries," U.S. Appl. No. 60/520,047, dated Nov. 13, 2003, 29 pages.
Nikkarinen et al., "Cosime: Real-life Cellular Network on the Desktop," Proceedings of the Joint International Conference on Autonomic and Autonomous Systems and International Conference on Networking and Services, Oct. 2005, 8 pages.
Noble et al., "Trace-Based Mobile Network Emulation," Proceedings of ACM SIGCOMM, Sep. 1997, 11 pages.
Parkvall et al., "WCDMA evolved—High-speed packet-data services,"Ericsson Review, No. 2, 2003, pp. 56-65.
Patzschke, "Systems and Methods for Monitoring and Evaluating a Connectivity Device," U.S. Appl. No. 60/586,426, dated Jul. 8, 2004. 55 pages.
Rajeev et al., "Preferred Roaming List Tracer," U.S. Appl. No. 60/693,462 dated Jun. 23, 2005, 21 pages.
Reves et al., "Real-Time Demonstrator for QoS Testing in 3G/4G Mobile Networks with IP Multimedia Applications," The Fifth European Wirless Conference: Mobile and Wireless Systems Beyond 3G, accepted Nov. 20, 2003, 9 pages.
Rhodes et al., "Chapter 6: Memory Manager," in "Palm OS Programming: The Developer's Guide," O'Reilly & Associates, Inc., Sebastopol, CA, 2002, pp. 1-2, 171-247.
Rischpater, "Chapter 3: Developing for the Qualcomm Brew Platform," in "Software Development for the Qualcomm Brew Platform," Springer-Verlag, New York, NY, 2003, pp. 1-2, 33-62.
Satoh, "Software Testing for Wireless Mobile Computing," IEEE Wireless Communications, vol. 11. No. 5, Oct. 2004, pp. 58-64.
Teyeb et al., "Respect: A Real-time Emulator for Service Performance Evaluation of Cellular Networks," IEEE 62nd Vehicular Technology Conference, vol. 1, Sep. 2005, pp. 402-406.
Topley et al., "Chapter 9: J2ME Programming Environments," in "J2ME in a Nutshell: A Desktop Quick Reference," pp. 267-299.
Wells, "J2ME Game Programming," Premier Press, Boston, MA, pp. 1-2, 13-268.

\* cited by examiner

SYSTEMS INCLUDING DEVICE AND NETWORK SIMULATION FOR MOBILE APPLICATION DEVELOPMENT

RELATED APPLICATIONS

This application is a division of U.S. application Ser. No. 14/084,321, filed Nov. 19, 2013 (now U.S. Pat. No. 9,298,864), which claims priority to U.S. application Ser. No. 12/705,913, filed Feb. 15, 2010 (now U.S. Pat. No. 8,589,140), which claims priority to U.S. Application No. 61/152,934, filed Feb. 16, 2009, and is a continuation-in-part of U.S. application Ser. No. 11/449,958, filed Jun. 9,2006 (now U.S. Pat. No. 7,813,910), which claims priority to U.S. Application No. 60/689,101, filed Jun. 10, 2005, all of which are incorporated herein by reference.

BACKGROUND

It is estimated that the mobile market is evolving at five times the speed of the eCommerce market. It is estimated that nearly 700 million new mobile devices will be shipped in 2005, with a new handset model being launched every other day. This rapid mobile device development requires that applications designed to run on these mobile devices also sustain rapid development. Development systems targeted at one mobile device may become obsolete and possibly of little value to the developer at the time it is shipped as well as development life cycles.

Many new mobile devices include a display management engine called a Flash Player; one example of a Flash Player suitable for mobile devices is FlashLite from Macromedia. The Flash Player provides a common application platform for playing applications on the mobile devices and allows developers to develop applications that may be played on multiple mobile devices that include the Flash Player. Applications for mobile devices are typically developed on a personal computer (PC) or workstation and target one or more types of mobile device that include a Flash Player. These applications require real-time testing of the application on all applicable mobile devices. Each mobile device has a certain amount of resources, such as processor, memory, graphics and networking. A certain portion of these resources is available for use by the application when it is executed (i.e., run) on the mobile device. Although a Flash Player application may operate correctly on one mobile device model, it may crash when playing on a different mobile device model. For example, a NOKIA 6600 has a 16% reduction in ARM CPU speed and available memory resources compared to a NOKIA 7610, thus an application that plays correctly on the NOKIA 7610 may not play correctly on the NOKIA 6600 due to this drop in inherent resources.

Development packages (e.g., FlashMX by Macromedia) are available to run on a PC and allow development of Flash Player applications for one or more mobile devices. However, although these development packages may simulate operation of the application playing on the targeted mobile device, they do not determine if the application will play correctly on the targeted mobile device based upon resource usage. Currently, the only way to determine if an application plays on a particular mobile device is to transfer the application to the device and play it. During development of an application for a mobile device, an application author may transfer and play the application hundreds of times (development life cycles) on the targeted mobile device before identifying and correcting all system resource problems within the application. Where an application is targeted to play on many types of mobile device, it must be transferred and tested on a mobile device representative of each targeted mobile device type. This transferring and testing process is time-consuming and therefore costly for the application author.

Furthermore, having accessibility to all available mobile devices in targeted geographical markets worldwide as well as real-time interaction with network operators to measure and emulate network characteristics within each market is presently not possible.

SUMMARY OF THE INVENTION

In one embodiment, a method emulates and profiles an application playing on a mobile device that includes an application player. Characteristics defining performance of the mobile device are loaded. The mobile device is emulated using a model based upon the characteristics. The application is played and monitored within the model to determine resource utilization of the application for the mobile device.

In another embodiment, a method authors, emulates and profiles an application playing on a mobile device that includes an application player. An application development tool authors the application and the mobile device is emulated using a model based upon the characteristics. The application is played within the model and the model is monitored to determine resource utilization of the application for the selected mobile device.

In another embodiment, an environment is provided for authoring an application to play on a mobile device that includes an application player. The application is authored using an application development tool. Resource utilization of the application for the mobile device is estimated. The steps of authoring and estimating are repeated until the resource utilization is less than or equal to the resources available on the mobile device.

In another embodiment, an emulator profiles an application of a mobile device that includes an application player, including: means for generating a model of the mobile device based upon mobile device characteristics, and means for playing the application within the model to determine resource utilization of the application when played by the mobile device.

In another embodiment, a method determines whether a frame-based application of a mobile device is operable. Characteristics are downloaded over the Internet for one or more mobile devices to be emulated and the application for the mobile devices is tested, via the Internet, using an emulator to determine if the application is operable on the mobile device.

DETAILED DESCRIPTION OF THE FIGURES

When developing a software program, a software developer often utilizes a software profiler to generate a report on the amount of time a processor spends in each routine of the software program during execution. The report may be used to find and optimize resource intensive areas of the software program. Some profiling modes report units other than time (such as call counts) and/or report at granularities other than per-routine. In the following description and examples, the term profiler may refer to a utility or function that determines or estimates mobile device resource utilization by an application running on that mobile device. For example, resource utilization may be determined for each output frame of a running frame-based application and displayed as a percentage of available resources for a particular mobile device.

Figure 1A:
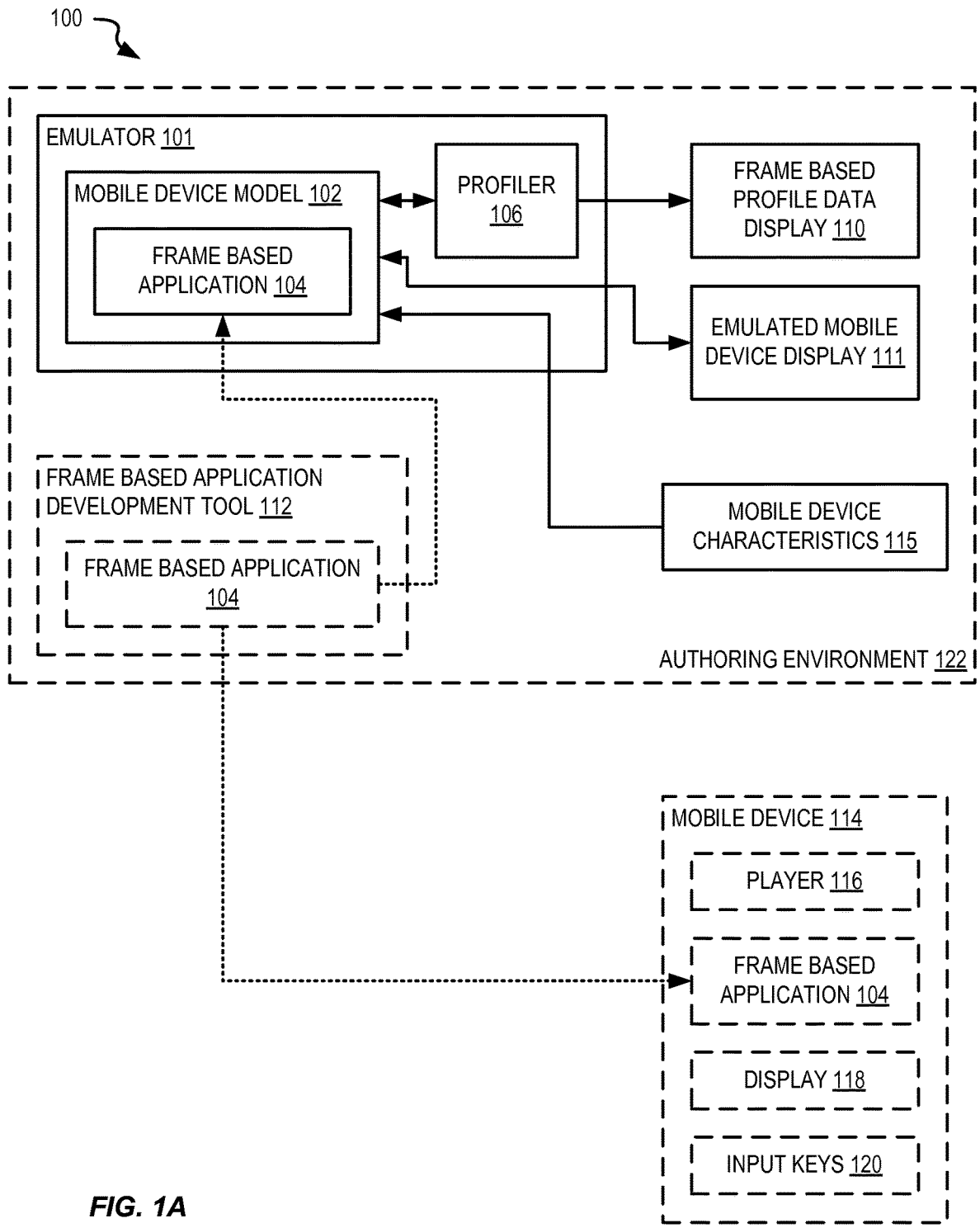
FIG. 1A shows one exemplary embodiment of a system for emulating, authoring and visually profiling a frame-based application playing on a mobile device that includes an application player.

FIG. 1A shows one exemplary embodiment of a system 100 for emulating and profiling a frame-based application 104 playing on a mobile device 114 that includes an application player 116. System 100 is shown with an emulator 101 and a profiler 106. Emulator 101 generates a mobile device model 102, based upon characteristics 115 of mobile device 114. Model 102 emulates mobile device 114 to play frame-based application 104 and may, for example, generate an emulated mobile device display 111 that represents mobile device 114. Emulated mobile device display 111 may be interactive to allow a user to interact (in a manner similar to interacting with mobile device 114) with application 104 while playing within model 102.

Mobile device 114 provides resources, such as processor resources, memory resources, graphic resources and networking resources, for use by application 104 when played within application player 116. Processor resources available for running application 104 may be defined as a percentage of total processing resources of mobile device 114; memory resources may be defined as a percentage of total memory within mobile device 114; graphic resources may be defined as a percentage of total graphical resources of mobile device 114; and networking resources may be defined as a percentage of total networking resources of mobile device 114. In one example, 40% of a processor resource within a mobile device is available for running application 104, indicating that application 104 may not exceed 40% of the available instruction cycles of the processor without potentially 'crashing' the mobile device.

Profiler 106 monitors playing of frame-based application 104 within model 102 to estimate resource usage of application 104 and generates a profile data display window 110. Profile data display window 110 allows a user of system 100 to identify areas within application 104 that would exceed resources of mobile device 114.

Application 104 may be developed using a frame-based application development tool 112 (indicated in dashed outline). Frame-based application development tool 112 may, for example, represent Flash MX or Studio 8 from Macromedia (now Adobe Systems) and application 104 may represent a Flash application. Once the user of system 100 has verified that the execution of application 104 does not exceed resources of mobile device 114, development tool 112 can be instructed to publish application 104 to mobile device 114, as shown.

In one example of operation, development tool 112 is used to develop frame-based application 104. Application 104 is transferred to emulator 101 for playing within mobile device model 102 to estimate resource usage of application 104 when played on mobile device 114. Upon playing application 104 within model 102, emulator 101 utilizes profiler 106 to determine resource utilization of application 104 based upon mobile device characteristics 115.

In one embodiment, emulator 101 is integrated with development tool 112 to form an authoring environment 122 that facilitates development and testing of application 104 without the need to continually load application 104 into mobile device 114.

In another embodiment, emulator 101 is an add-in module that may be configured to operate within development tool 112.

Mobile device 114 is shown with application player 116, display 118 and input keys 120. In one embodiment, application player 116 is Flash Lite from Macromedia (Adobe Systems). Mobile device 114 may, for example, represent one of: a cell phone, a personal digital assistant (PDA), an interactive home appliances and other such devices. In one example, display 118 represents a color liquid crystal display (LCD) device for displaying text and images to a user of mobile device 114 and input keys 120 represent buttons that allow the user to interact with mobile device 114.

Figure 1B:
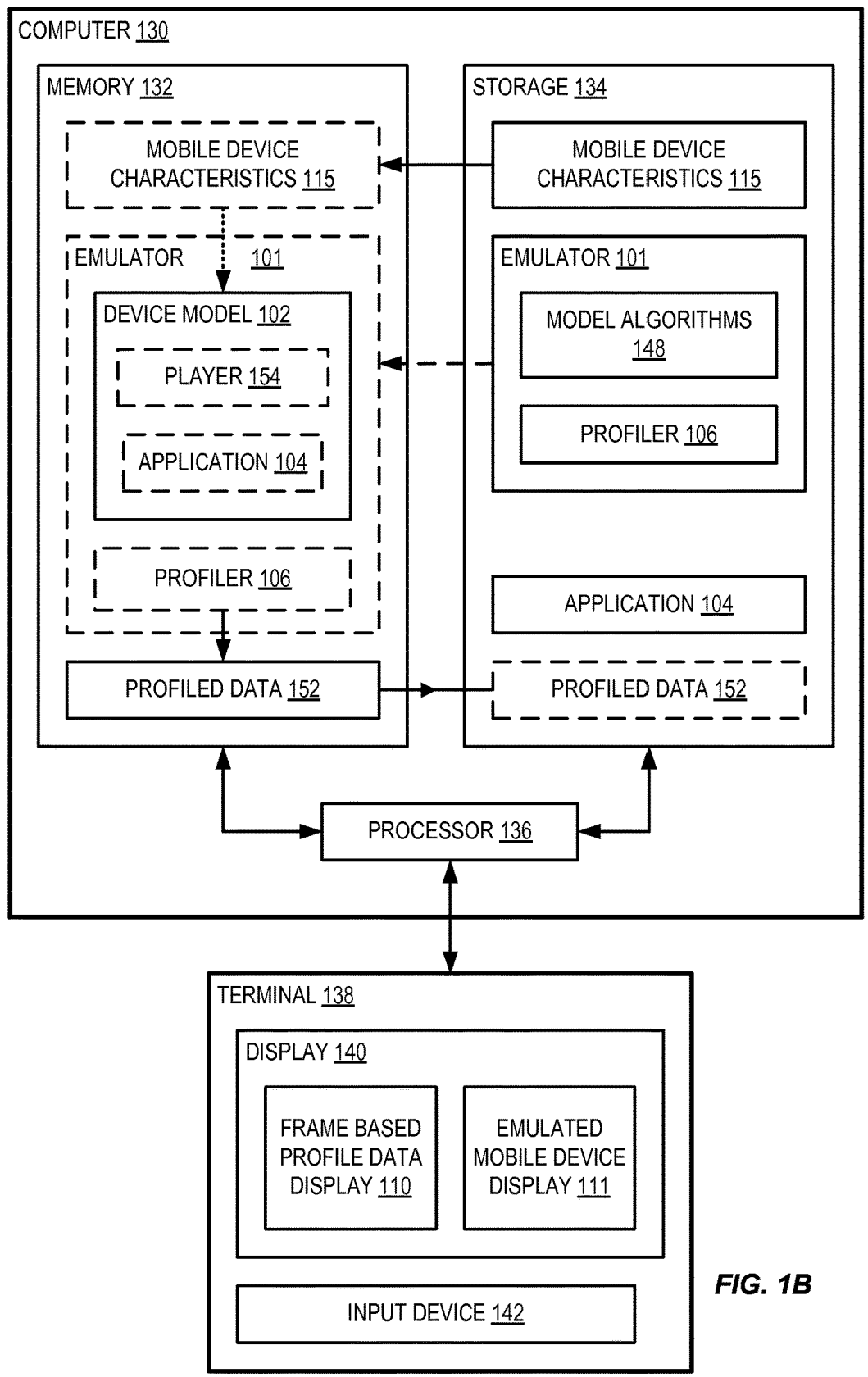
FIG. 1B shows one exemplary embodiment of the system of FIG. 1A within a computer.

FIG. 1B shows one exemplary embodiment of system 100 within a computer 130. Computer 130 includes memory 132, storage 134 and a processor 136. Memory 132 is for example random access memory (RAM) and storage 134 is for example a disk drive or other non-volatile storage media.

Storage 134 is shown with emulator 101, mobile device characteristics 115 and application 104. Storage 134 may also include development tool 112, if desired, for developing application 104. Emulator 101 includes model algorithms 148 and profiler 106. Model algorithms 148 represent one or more algorithms that operate to generate mobile device model 102 to emulate mobile device 114 while executing application 104. Specifically, model algorithms 148 define operation of mobile device 114 based upon mobile device characteristics 115.

TABLE 1

Mobile Device Characteristics

| Parameter | Value |
| --- | --- |
| Name | NOKIA 3650 |
| Processor | ARM 4T |
| Processor Speed | 104 MHz |
| Storage Access Speed | 5.88 files/second |
| RAM Size | 256 MB |
| Storage Size | 512 MB |
| Display Width | 256 |
| Display Height | 394 |
| Pixel Depth | 24 |
| Processor Availability | 60% |
| RAM Availability | 60% |
| Storage Availability | 40% |

Table 1 Mobile Device Characteristics', shows exemplary characteristics that may be used to specify hardware attributes and performance of model 102 to emulate mobile device 114. For example, in Table 1, the characteristics have the following meaning: 'Processor' specifies the type of the processor in mobile device 114; 'Processor Speed' specifies the clocked speed of the processor within mobile device 114; 'Storage Access Speed' specifies the rate at which data can be moved from storage to memory and/or screen within mobile device 114; 'RAM Size' specifies the size of the RAM in mobile device 114; 'Storage Size' specifies the size of the non-volatile memory in mobile device 114; 'Display Width' specifies the number horizontal pixels on display 118 of mobile device 114; 'Display Height' specifies the number of vertical pixels of display 118; 'Pixel Depth' specifies the number of bits per pixel (e.g., the color depth) of display 118; 'Processor Availability' specifies the percentage of processing resource available for use by applications (e.g., where mobile device 114 represents a cell phone, the phone has to maintain 'phone' operations while running any applications, thus there may only be a portion of the maximum processing resource available to applications); 'RAM Availability' specifies the percentage of RAM available to applications; and 'Storage Availability' specifies the percentage of non-volatile storage space available to applications.

Figure 8:
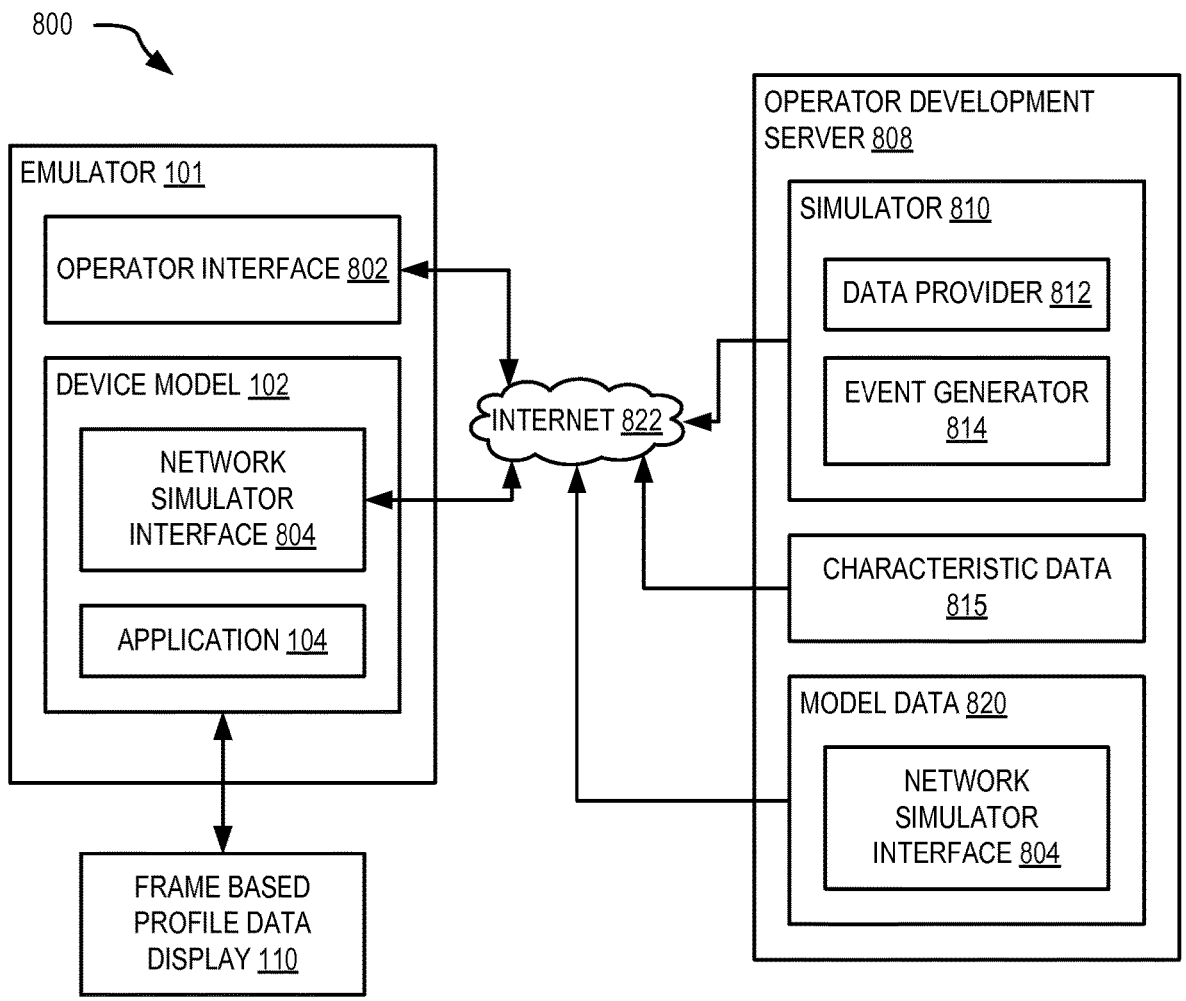
FIG. 8 is a block diagram illustrating the emulator of FIG. 1 interacting with an operator development server via the Internet for simulating playing of the application within a mobile device connected to a wireless network.

Table 1 may be represented as a data structure (e.g., shown as mobile device characteristics 115 within storage 134) and may be stored in a file (not shown) or a database (not shown) within storage 134, or stored remotely (e.g., on operator development server 808, FIG. 8, for download into authoring environment 122 as necessary). System 100 may include mobile device characteristics (e.g., mobile device characteristics 115) for multiple devices (e.g., mobile device 114). For example, characteristics 115 may be included for each mobile device type targeted by application 104. A user of system 100 may then select one or more target mobile devices from a list based upon available characteristics 115. As appreciated, additional or fewer characteristics may be included within characteristics 115 to specify hardware attributes and performance of mobile device 114 without departing from the scope hereof.

As new mobile device types are created, additional mobile device characteristics 115 may be easily created to specify hardware attributes and performance of the new device types, allowing application development to start before a physical mobile device is available. For example, if a company introduces a new series of six mobile phone handsets, six additional sets of mobile device characteristics 115 may be created based upon measured (e.g., by running benchmarks on the new handsets or prototype) or determined (e.g., by estimating performance based upon previous models) performance thereby allowing emulation and evaluation of applications targeting these new devices.

In one embodiment, mobile device characteristics 115 may be supplied with a device model specific to one mobile device. For example, a manufacturer may supply a combined device model and characteristics for each mobile device 114. Emulator 101 may then utilize the combined device model as device model 102.

In one example, computer 130 may include an interface (not shown) that provides communication with mobile device 114 via one or more of: USB, Ethernet, infra-red, Bluetooth, WiFi and other similar communication media. This interface may, for example, allow application 104 to be deployed on mobile device 114 for final testing of application 104.

In one example of operation, processor 136 loads at least part of emulator 101 into memory 132 for execution. Emulator 101 then generates mobile device model 102, based upon characteristics 115, within memory 132. Emulator 101 then loads and plays application 104 within model 102. In all embodiments described herein, it is to be noted that emulation is performed on a processor extrinsic to the mobile device being emulated. Emulator 101 may load all or part of profiler 106 into memory 132 to monitor resources and/or performance of application 104 within model 102. Specifically, as application 104 is played (i.e., utilizing an application player 154) within model 102, profiler 106 monitors and records, as profiled data 152, resources utilized by application 104. Profiled data 152 may be stored (as shown in dashed outline) within storage 134 and/or displayed as profile data display window 110 on display 140 of terminal 138. In particular, profile data display 110 may be used to identify areas within application 104 whereupon playing of application 104 within mobile device 114, performance of mobile device 114 would be stressed. Thus, areas where failure may occur within application 104 may be identified prior to running application 104 on mobile device 114. For example, emulator 101 may display all or part of profiled data 152 on display 140 to facilitate development of application 104.

Figure 2:
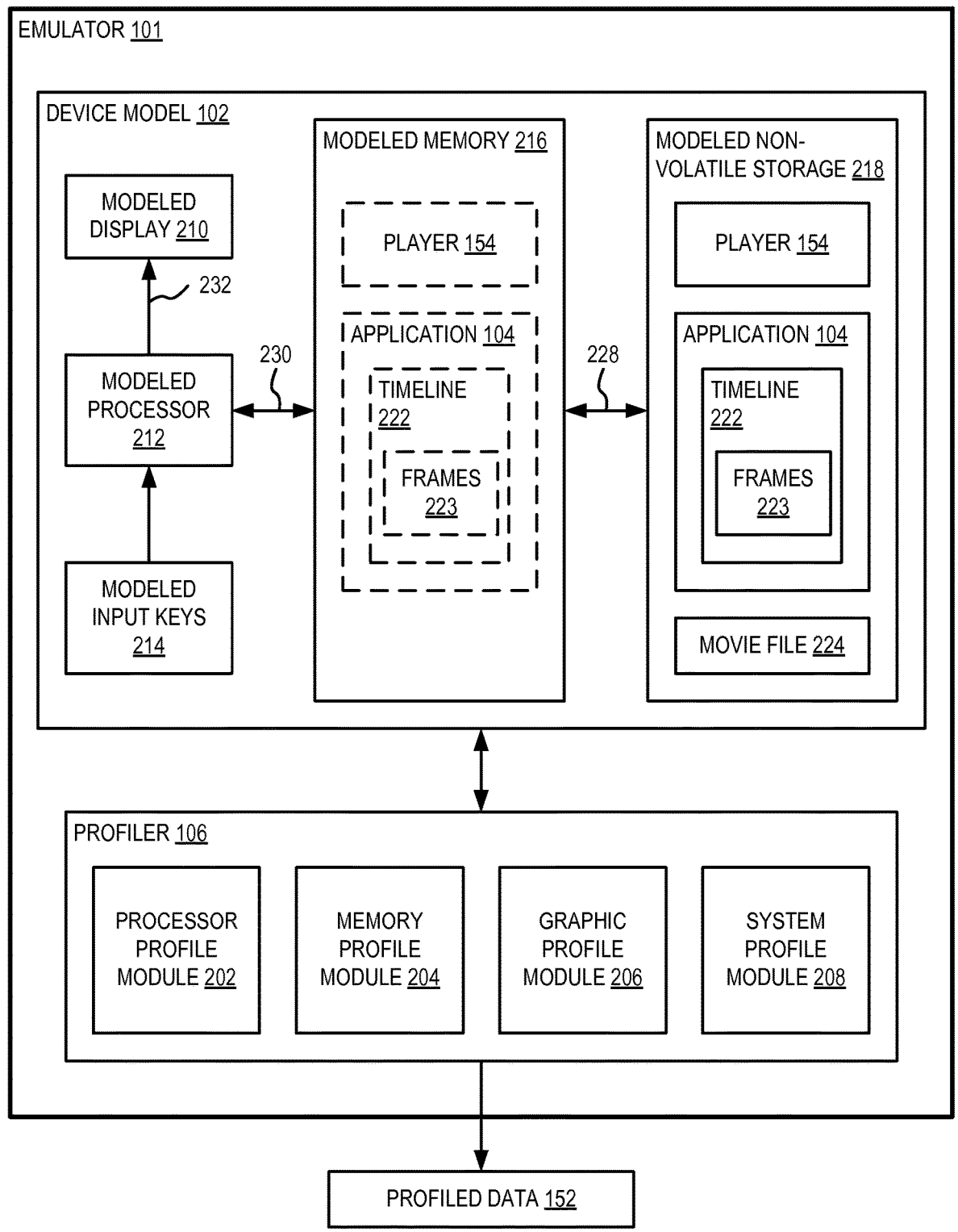
FIG. 2 is a block diagram illustrating detail of an emulator of the system of FIGS. 1A and 1B.

FIG. 2 is a block diagram illustrating emulator 101 of FIGS. 1A and 1B in further detail. In particular, profiler 106, within emulator 101, is shown with a processor profile module 202, a memory profile module 204, a graphic profile module 206 and a system profile module 208. Processor profile module 202 may, for example, estimate processor utilization of application 104 within model 102. Memory profile module 204 may, for example, estimate memory utilization by application 104 within model 102. Graphic profile module 206 may, for example, estimate utilization of 30 fill rate and 30 polygon count of application 104 within model 102. System profile module 208 may, for example, determine overall system utilization of application 104 within model 102. More or fewer profile modules may be included within profiler 106 without departing from the scope hereof.

Device model 102, within emulator 101, has a modeled display 210, a modeled processor 212, modeled input keys 214, modeled memory 216 and modeled non-volatile storage 218. In this example, modeled display 210 represents display 118 of mobile device 114, FIG. 1, processor 212 represents a processor (not shown) of mobile device 114, modeled input keys 214 represent input keys 120 of mobile device 114, modeled memory 216 represents memory (e.g., RAM) of mobile device 114 and modeled non-volatile storage 218 represents non-volatile storage (e.g., flash memory, disk drive storage) of mobile device 114. Fewer or more elements and/or components of mobile device 114 may be modeled within device model 102 without departing from the scope hereof.

Modeled non-volatile storage 218 is shown with application player 154 that may be the same as, or similar to, application player 116, FIG. 1. In one example, application player 154 has similar operation to application player 116, but includes modifications that facilitate monitoring of application 104 within model 102 by profiler 106.

Flash applications are based upon a timeline of frames that may include graphical information and action scripts, FS Commands, network protocols, selected frame rate, etc. Application player 116 within mobile device 114 thus operates upon a time line of frames within application 104 to provide graphical displays (e.g., animations, rich media content) upon display 118. Accordingly, profiled data 152 may also be based upon the timeline and frames of application 104 and displayed (e.g., via profile data display window 110) as resource utilization related to one or more of: timeline, frames and processing performance of action scripts.

In FIG. 2, application 104 is shown with a timeline 222 that includes frames 223. Each frame of frames 223 may include graphics and/or action scripts that generate the graphical image for display. For example, an action script may reference one or more graphic files (e.g., movie file 224) to provide graphical images for emulated mobile device display 111. Where each frame of frames 223 includes multiple graphic elements and/or action scripts that involve image manipulation (e.g., retrieving data from non-volatile storage, avatar manipulations, animations, etc.), each frame may require differing resources in order to display correctly. For example, where a frame includes Avatar (e.g., an animated character) manipulation, a certain amount of processor resource is required, whereas a frame that is based upon movie file 224 may simply require data transfer time. If mobile device 114 has insufficient processor resources (e.g., because the animation is too complex for the targeted mobile device), application 104 may crash (i.e., cease to function correctly). Thus, it is important to determine the 'stress' applied by application 104 to resources of mobile device 114.

In one example of operation, application player 154 plays application 104 within model 102. In particular, player 154 processes frames 223 of application 104 based upon ordering of frames 223 within timeline 222. One or more profile modules 202, 204, 206 and 208 within profiler 106 monitor resource utilization of each frame, storing results as profiled data 152. Profiled data 152 is then displayed as profile data display window 110 on display 140 for review by the user. Profiled data 152 may be displayed in real time as application 104 is played within model 102. Alternatively, the user may scroll through profiled data 152 as desired by interacting with profile data display 110. Alternatively, profiled data 152 may be output as a report (not shown). The user interacts with emulated mobile device display 111 to control application 104 as if application were running on mobile device 114.

Figure 3:
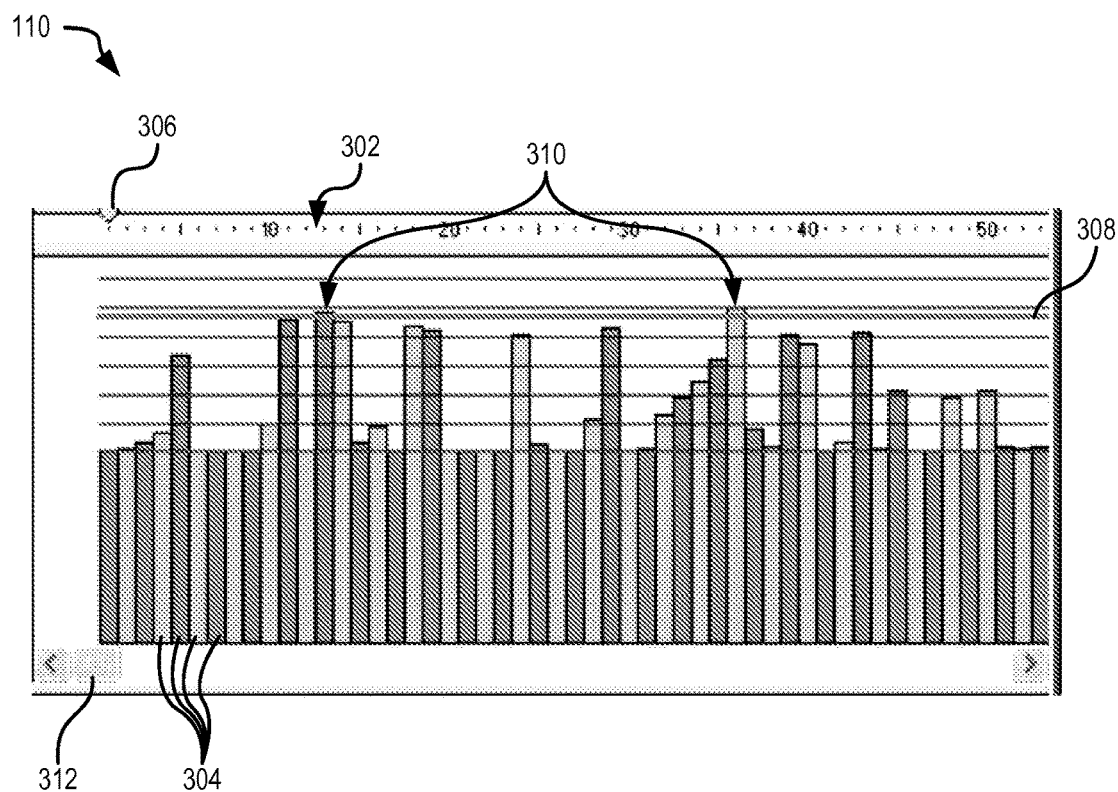
FIG. 3 is a display showing one exemplary frame-based profile graph.

FIG. 3 shows one exemplary profile data display window 110 showing a frame-based display of profiled data 152, FIG. 1B, determined by processor profile module 202. In particular, profile window 110 is shown with a time line 302 that represents timeline 222 of application 104. In this example, each bar 304 indicates processor resource utilization for each of certain frames 223 of application 104. In each embodiment of the present system described herein, each bar may, alternatively, represent a particular point or period in time during the execution of an application 104 which is non-frame-based. During play of application 104 within model 102, a current position indicator 306 shows the frame (i.e., frame 1 in this example) currently displayed by emulated mobile device display 111 (see FIG. 4). A capacity line 308 (capout line) indicates the maximum processor resource available to application 104. Where bars 304 rise above capacity line 308 at locations 310, resource utilization for indicated frames of application 104 exceed the available processor resources of mobile device 114; thus application 104 may 'capout' or crash when playing those frames. Profile window 110 displays per-frame (or point-in-time) processor resource utilization of application 104, thereby facilitating assessment of stresses applied to mobile device 114 when playing application 104. Where the number of frames 223 of application 104 exceeds the display capacity of profile window 110, a scroll bar 312 allows the user to scroll through bars 304 for application 104.

Other profile modules 204, 206 and 208, may have similar displays that indicate resource utilization during playing of application 104 within model 102, thereby estimating resource utilization of application 104 when played within mobile device 114.

Figure 4:
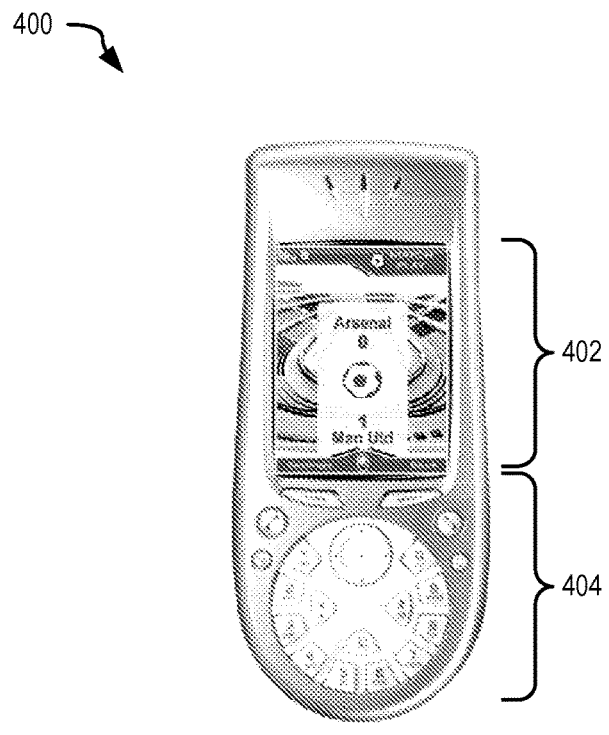
FIG. 4 is a display showing the modeled mobile device of FIGS. 1A and 1B.

FIG. 4 shows one exemplary display 400 generated from device model 102 within emulator 101, FIG. 1. In particular, display 400 shows an image (e.g., generated from a bitmap of mobile device 114) of mobile device 114 with a display area 402 and input keys 404. Display 400 allows the user to see and interact with an application running within device model 102. For example, display area 402 may represent display 118 of mobile device 114 and input keys 404 may represent input keys 120 of mobile device 114.

Figure 5:
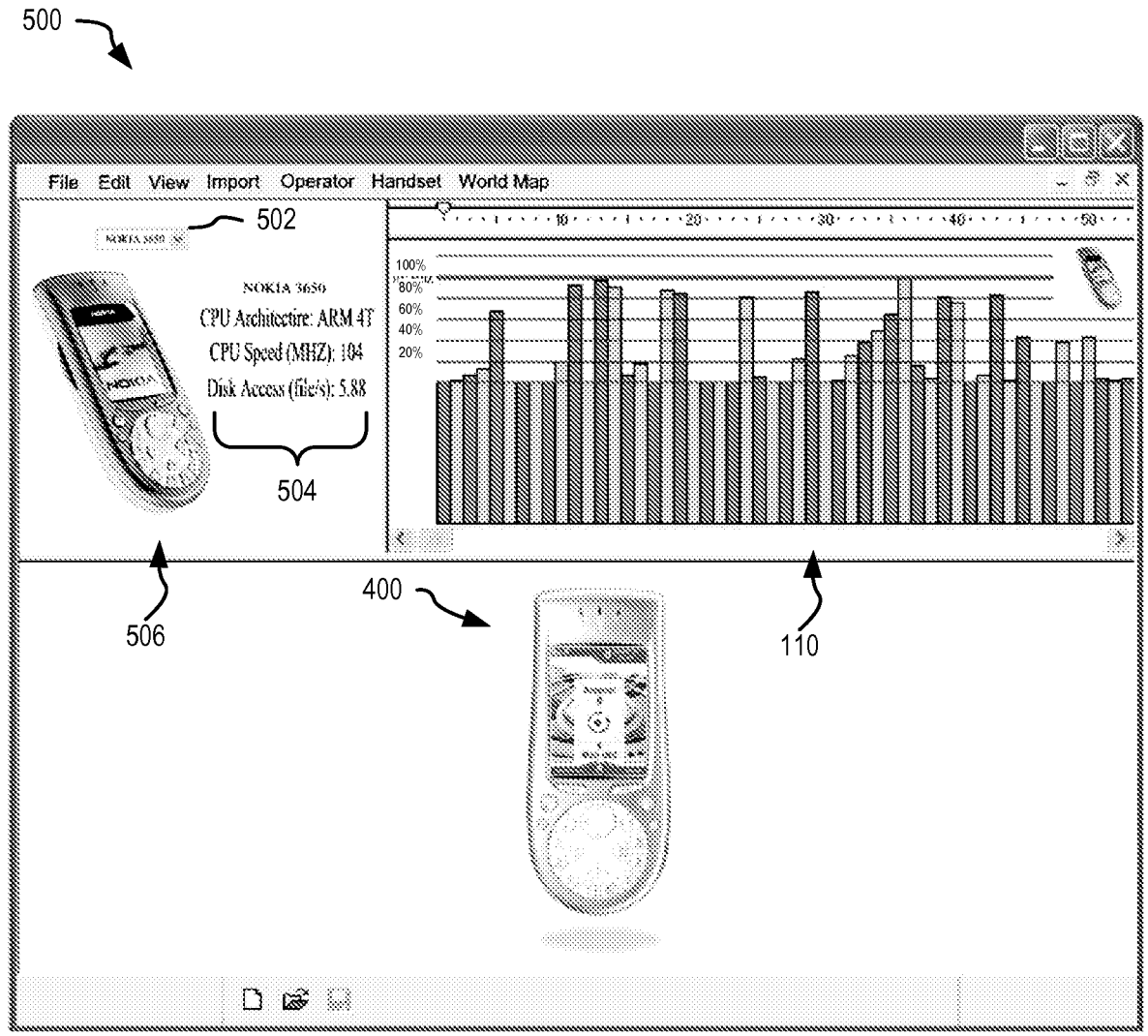
FIG. 5 shows one exemplary window that includes the display of FIG. 3, the display of FIG. 4 and an exemplary user interface.

FIG. 5 shows an exemplary window 500 that includes profile window 110 of FIG. 3 and display 400 of FIG. 4 and an exemplary user interface. In particular, window 500 shows selection of a mobile device (i.e., NOKIA 3650 in this example) from a pull-down list 502 that results in display of characteristics 504 of the selected mobile device in system information window 506. Characteristics 504 may represent characteristics 115 of FIG. 1A, for example. System information window 506 may contain information related to system resource utilization with respect to the handset CPU and memory, the executing application, and network and various system resources. Window 500 facilitates interaction with model 102 through display 400 and monitoring of resource utilization of application 104 through profile window 110. Furthermore, pull-down list 502 allows easy selection of further mobile devices upon which application 104 is to be profiled.

Figure 6:
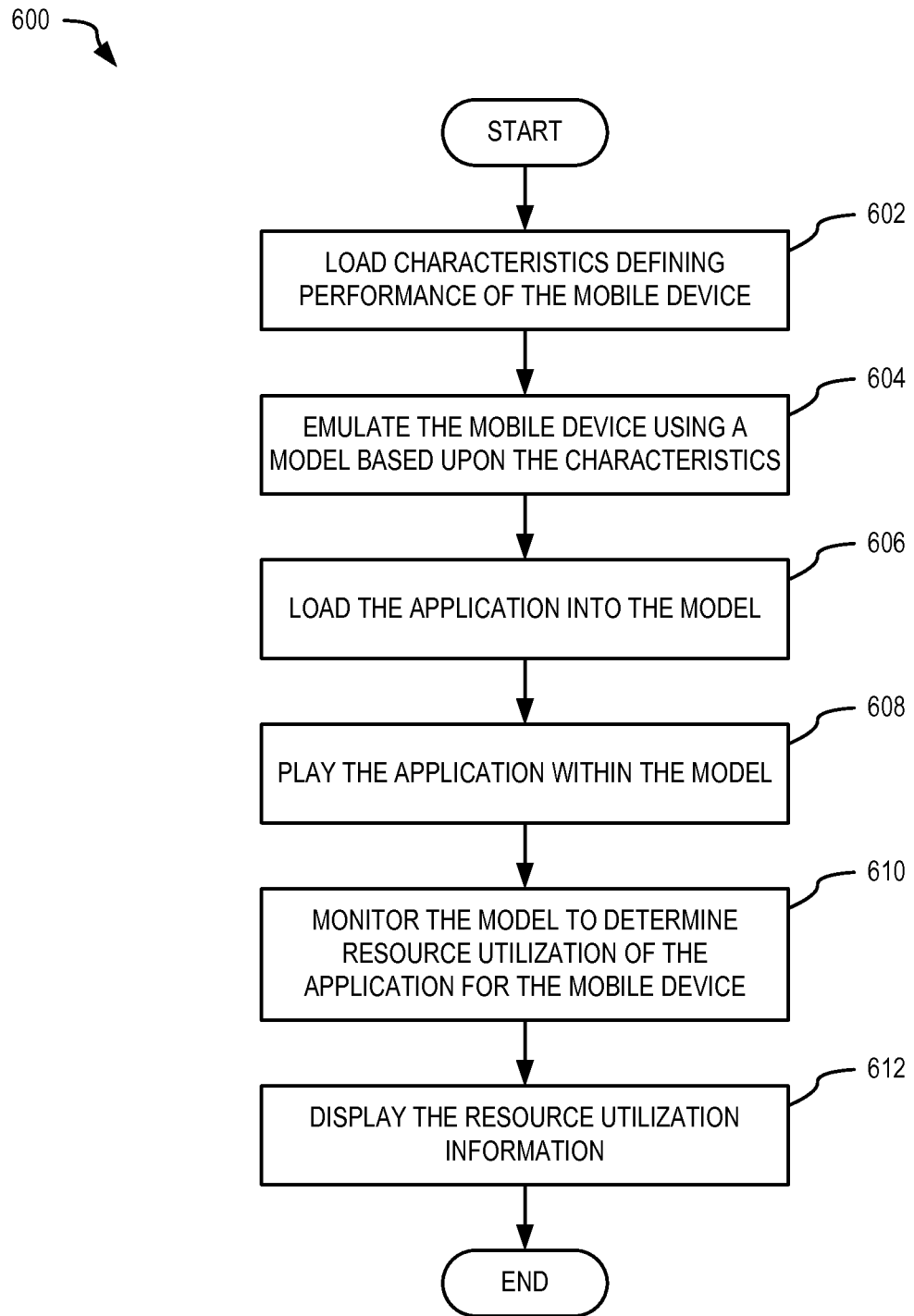
FIG. 6 is a flowchart illustrating a method for modeling and profiling a frame-based application to play on a mobile device that includes an application player.

FIG. 6 is a flowchart illustrating a method 600 for modeling and profiling an application playing on a mobile device that includes an application player. Method 600 may, for example, be implemented within emulator 101.

In step 602, method 600 loads characteristics defining hardware attributes and performance of the mobile device. In one example of step 602, a user of window 500 selects a mobile device using pull-down list 502 and emulator 101 loads mobile device characteristics 115 into memory 132.

In step 604, method 600 emulates the mobile device using a model based upon the characteristics. In one example of step 604, emulator 101 generates device model 102 based upon mobile device characteristics 115.

In step 606, method 600 loads the application into the model. In one example of step 606, emulator 101 loads application 104 into device model 102.

In step 608, method 600 plays the application within the model. In one example of step 608, emulator 101 plays application 104 within model 102.

In step 610, method 600 monitors the application playing in the model to determine resource utilization of the application for the mobile device. In one example of step 610, emulator 101 utilizes profiler 106 to monitor application 104 playing within model 102 to determine profiled data 152.

In step 612, method 600 displays the resource utilization information. In one example of step 612, emulator 101 displays all or part of profiled data 152 as frame-based profile data display window 110 on display 140.

Figure 7:
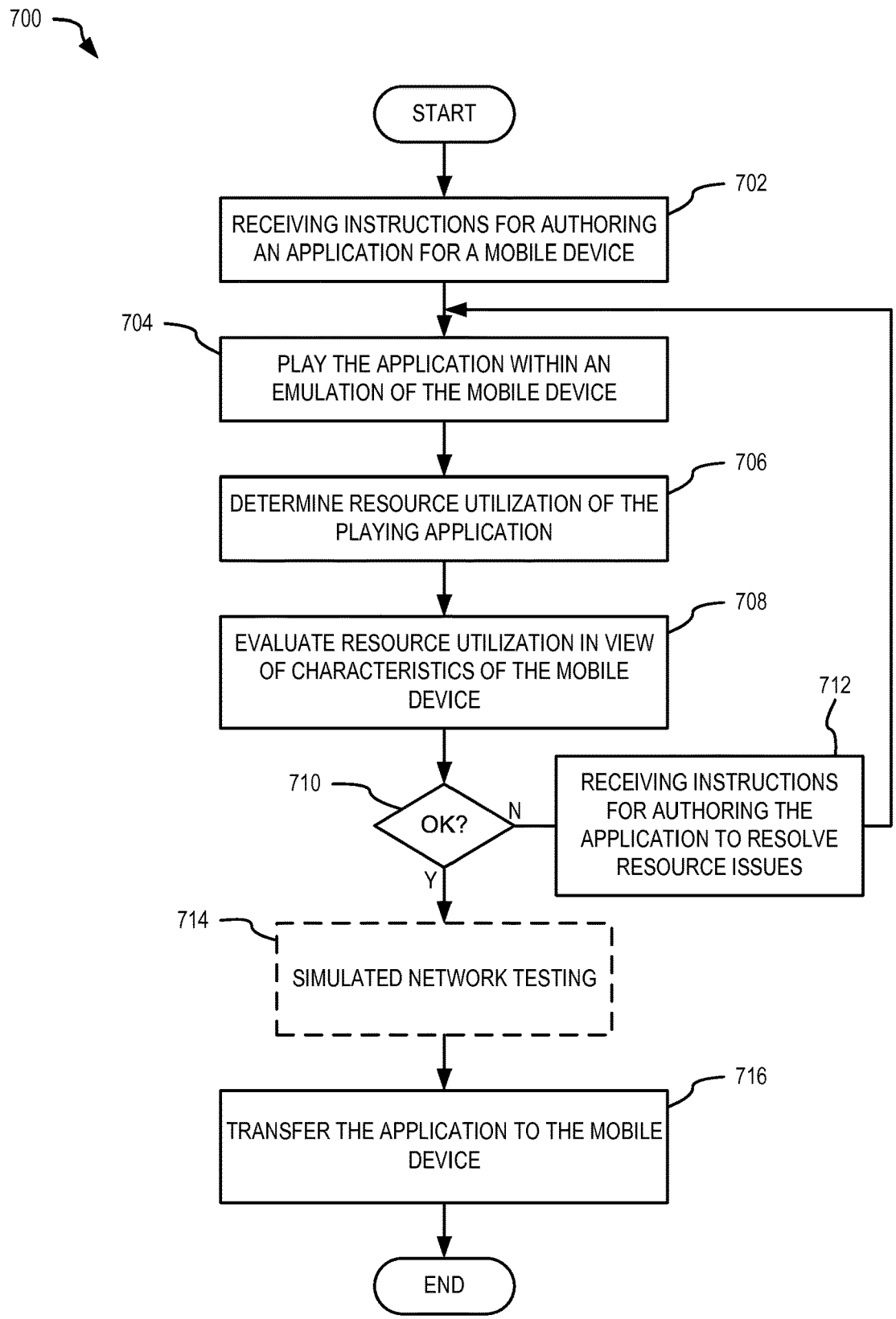
FIG. 7 is a flowchart illustrating one method for authoring, emulating and profiling a frame-based application to play on a mobile device that includes an application player.

FIG. 7 is a flowchart illustrating one method 700 for authoring, emulating and profiling an application to play on a mobile device that includes an application player. Method 700 may be implemented within emulator 101, for example.

In step 702, method 700 receives instructions for authoring an application for a mobile device. In one example of step 702, a user interacts with frame-based application development tool 112 to author application 104.

In step 704, method 700 plays the application within an emulation of the mobile device. In one example of step 704, emulator 101 generates model 102 based upon characteristics 115 of mobile device 114 and then loads and plays application 104 within model 102.

In step 706, method 700 determines resource utilization of the playing application. In one example of step 706, emulator 101 utilizes one or more profile modules 202, 204, 206 and 208 of profiler 106 to determine resource utilization of application 104 within model 102 and stores the resource utilization information as profiled data 152.

In step 708, method 700 evaluates resource utilization in view of characteristics of the mobile device. In one example of step 708, emulator 101 evaluates profiled data 152 to determine, based upon characteristics 115, if resource utilization is within available resources of mobile device 114.

Step 710 is a decision. If in step 710, method 700 determines that the resource utilization of step 708 is within available resources of mobile device 114 (i.e., OK), method 700 continues with step 714; otherwise method 700 continues with step 712.

In step 712, method 700 receives instructions for authoring the application to resolve resource issues. In one example of step 712, the user modifies application 104, based upon determined resource utilization of step 708, using development tool 112. Method 700 continues with step 704. Steps 704 though 712 thus repeat until the estimated resources requirement of the application is within available resources of the mobile device.

Step 714 is optional and is particularly suited for testing applications (e.g., application 104) running on a mobile device (e.g., mobile device 114) that is a mobile phone. In step 714, emulator 101 interacts with one or more operator development servers (e.g., operator development server 808, FIG. 8) to configure device model 102 for simulated network operation to allow testing of application 104 within a simulated wireless network environment (e.g., a simulated mobile phone wireless network environment). Simulated network operation is described in further detail below and shown in FIGS. 8 though 13.

In step 716, method 700 transfers the application to the mobile device. In one example of step 716, emulator 101 instructs development tool 112 to publish application 104 to mobile device 114.

FIG. 8 is a block diagram illustrating interaction of emulator 101 with an operator development server 808 via Internet 822 for simulating playing of application 104 within a mobile device connected to a wireless network (e.g., a mobile phone wireless network). FIGS. 9, 10, 11 and 12 show exemplary windows that allow a user to interact with emulator 101 for configuring and testing operation of application 104 within model 102 when simulating connection to a wireless network. FIGS. 8, 9, 10, 11 and 12 are best viewed together with the following description.

Emulator 101 is shown with an operator interface 802 that interacts with operator development server 808 via Internet 822. Internet 822 may, for example, represent the world wide web (WWW), an Intranet or any fixed or wireless server connection. Operator development server 808 is shown with a simulator 810, characteristic data 815 and model data 820. Model data 820 may, for example, represent live network profiles. To facilitate connection to operator development server 808, a user of emulator 101 purchases a subscription from a provider of operator development server 808 (or from a third party) that allows emulator 101 to connect to operator development server 808 via Internet 822. Upon connection to operator development server 808, emulator 101 may download characteristic data 815 from operator development server 808 for one or more mobile device types supported by operator development server 808 (i.e., supported by the operator's wireless network). Characteristic data 815 may, for example, represent mobile device characteristics 115 of FIG. 1. Further, emulator 101 may download additional model data 820 for use within device model 102 for increasing simulated functionality of model 102 (e.g., simulating additional handset functionality and/or network functionality). The user of emulator 101 may, for example, purchase model data 820 for additional mobile device types as they become available, thereby allowing emulator 101 to include modeling capability for a new pre-release mobile device, scheduled release mobile device and current mobile devices. Alternatively, the use of characteristic data 815 and model data 820 may be included within a monthly subscription fee, thereby allowing the user to author applications for new mobile devices (e.g., new mobile phone models and live mobile profiles) provided by an operator (e.g., mobile phone wireless network operator).

In one example of operation, emulator 101 downloads a network simulator interface 804 from operator development server 808 into device model 102 as shown in FIG. 8. Network simulator interface 804 includes functionality that allows device model 102 to communicate with simulator 810 to simulate connectivity of mobile device 114 with a wireless network. Specifically, network simulator interface 804 within model 102 interacts with data provider 812 and event generator 814 to determine resource utilization resulting from network interaction by model 102. Thus, as application 104 plays within model 102, the effects of mobile device 114 interacting with a wireless network are simulated such that frame-based profile data display window 110 shows resource utilization that includes the live or scripted effects of interaction with the wireless network. In one embodiment, capacity line 308 in profile data display window 110 is dynamically modified to show actual resource availability to application 104 resulting from resource utilization by simulated wireless network activity within device model 102. For example, if a message is received and/or retrieved by model 102 while playing application 104, certain resources are required to handle the received message, and therefore available resources for application 104 is reduced accordingly.

Simulator 810 is shown with a data provider 812 and an event generator 814. Data provider 812 may, for example, simulate data transfers within a wireless network. For example, the data transfer may be cased upon a certain bandwidth associated with the wireless network. Event generator 814 may, for example, generate certain events (e.g., incoming calls, incoming text messages, etc) that occur within a wireless network. Simulator 810, using data provider 812 and event generator 814, thus interacts with network simulator interface 804 to model operation of a wireless network (e.g., a mobile phone network).

Operator interface 802 may interact with multiple operator development servers 808 to facilitate testing of application 104 with many operators' networks. As appreciated, where application 104 is designed to function on multiple mobile devices operating on wireless networks worldwide, operator network simulation removes the burden of traveling to operator network locations from application developers, since application operation on a mobile device connected to a network may be simulated by emulator 101 and thus measured back against the authoring environment.

Figure 9:
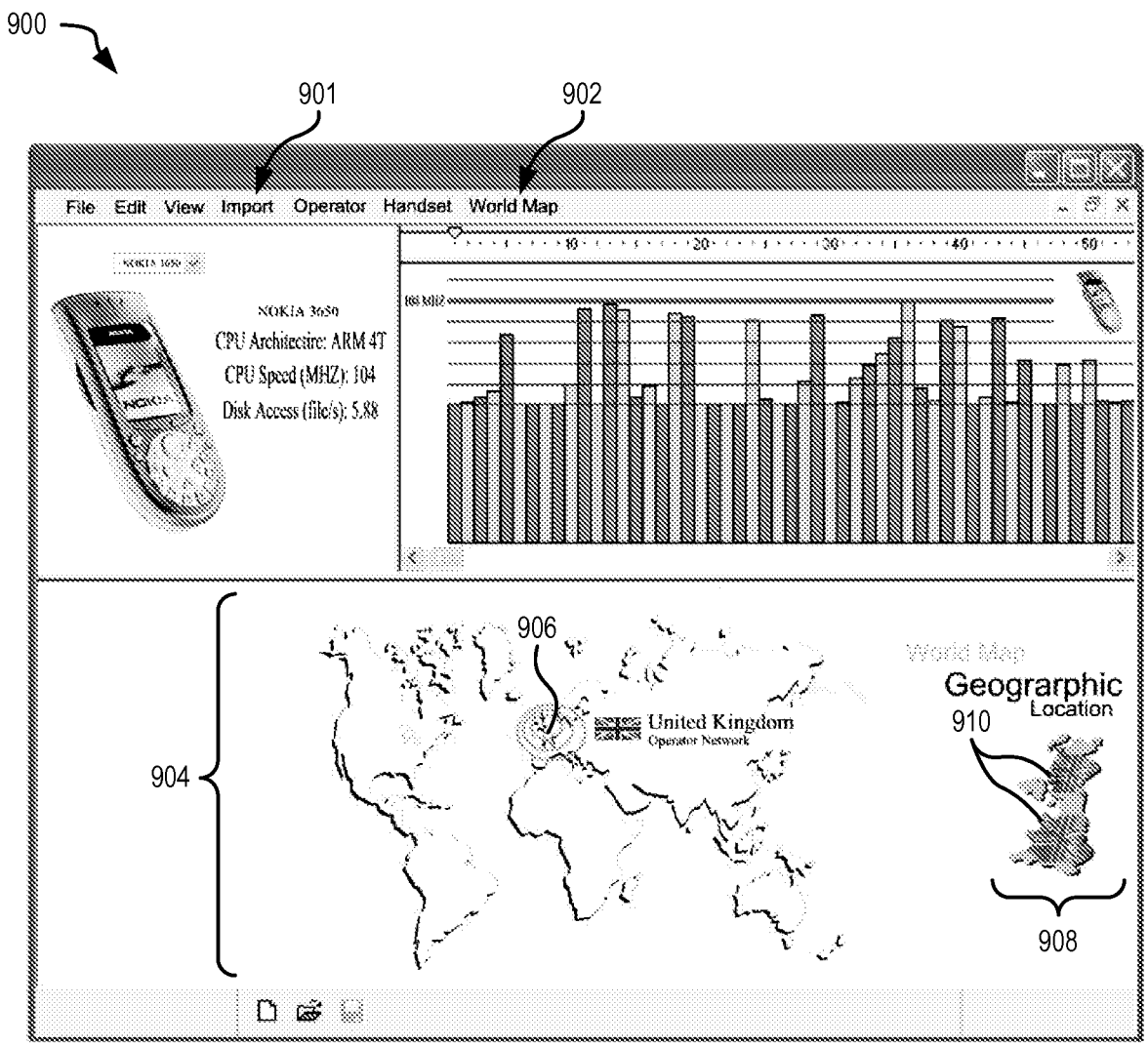
FIGS. 9, 10, 11 and 12 show exemplary user interface screens for interacting with the emulator of FIG. 1 to configure and test operation of the application within the model of the mobile device when connected to a wireless network.
Figure 10:
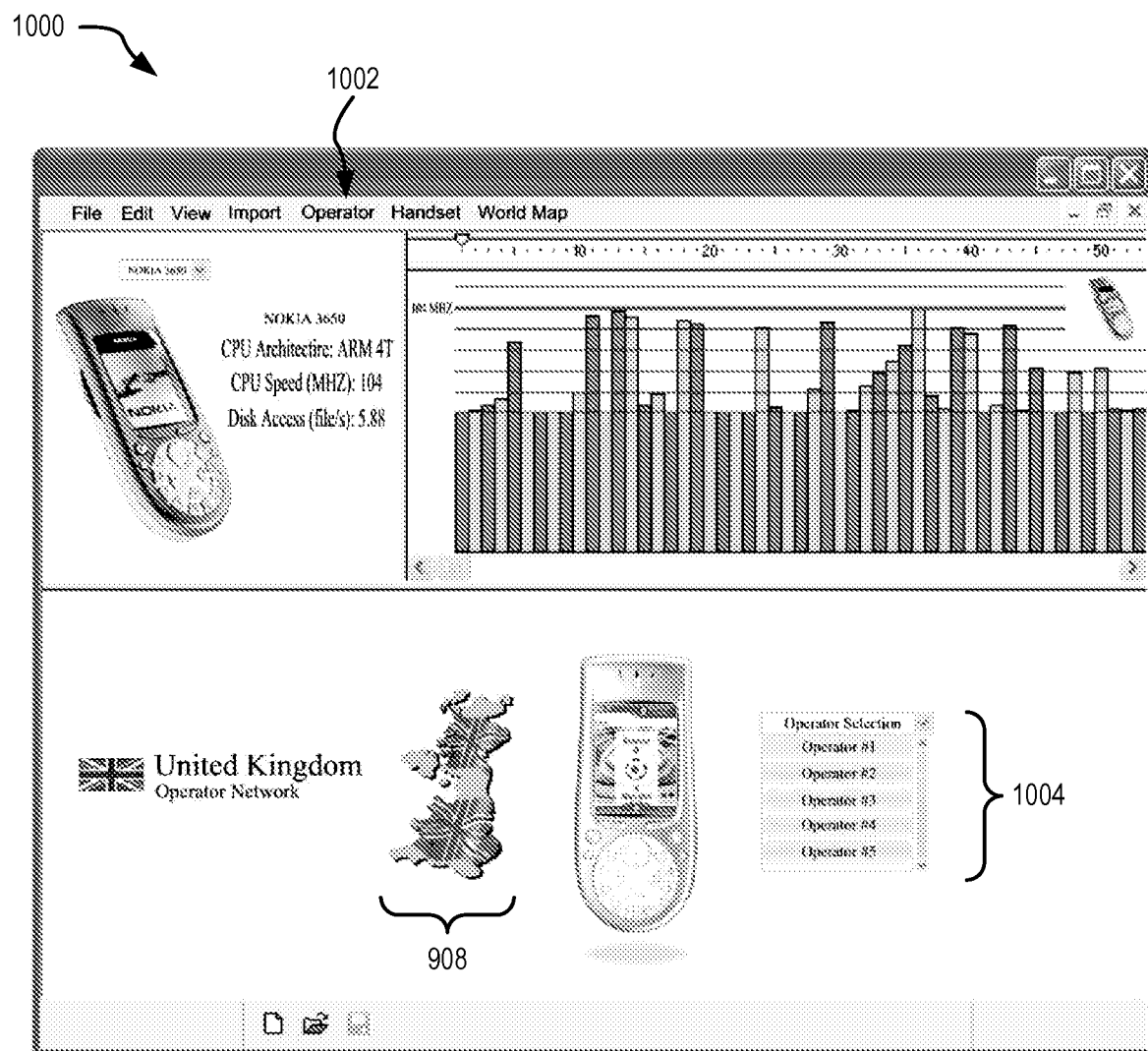

FIG. 9 shows one exemplary window 900 for selecting operator networks based upon a desired geographic location. Window 900 shows a menu item 902 that, upon selection by the user, displays a world map 904 that allows the user to select a geographical region in which mobile device 114 is to operate. For example, window 900 shows a mouse pointer 906 selecting the United Kingdom, resulting in a sub-map display 908 of the selected location showing available wireless networks 910. Sub-map display 908 is, for example a 'mouse-over' event. Upon selection of the location, world map 904 is replaced by sub-map 908 of the selected location and a pull-down list 1004 of available operators within that location as shown in window 1000, FIG. 10. Alternatively, the use may select menu item 1002 to display pull-down list 1004.

Figure 11:
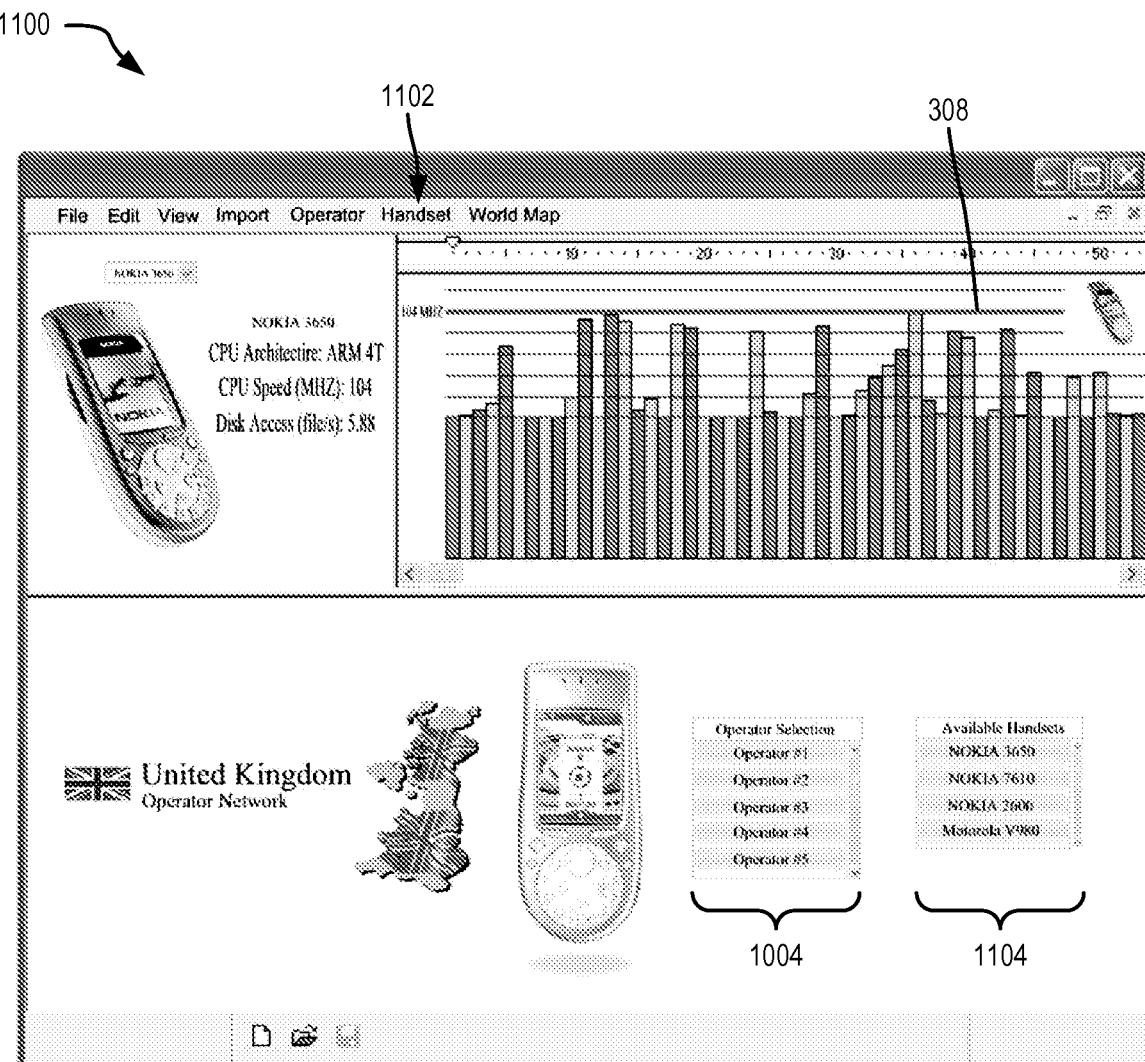
Figure 12:
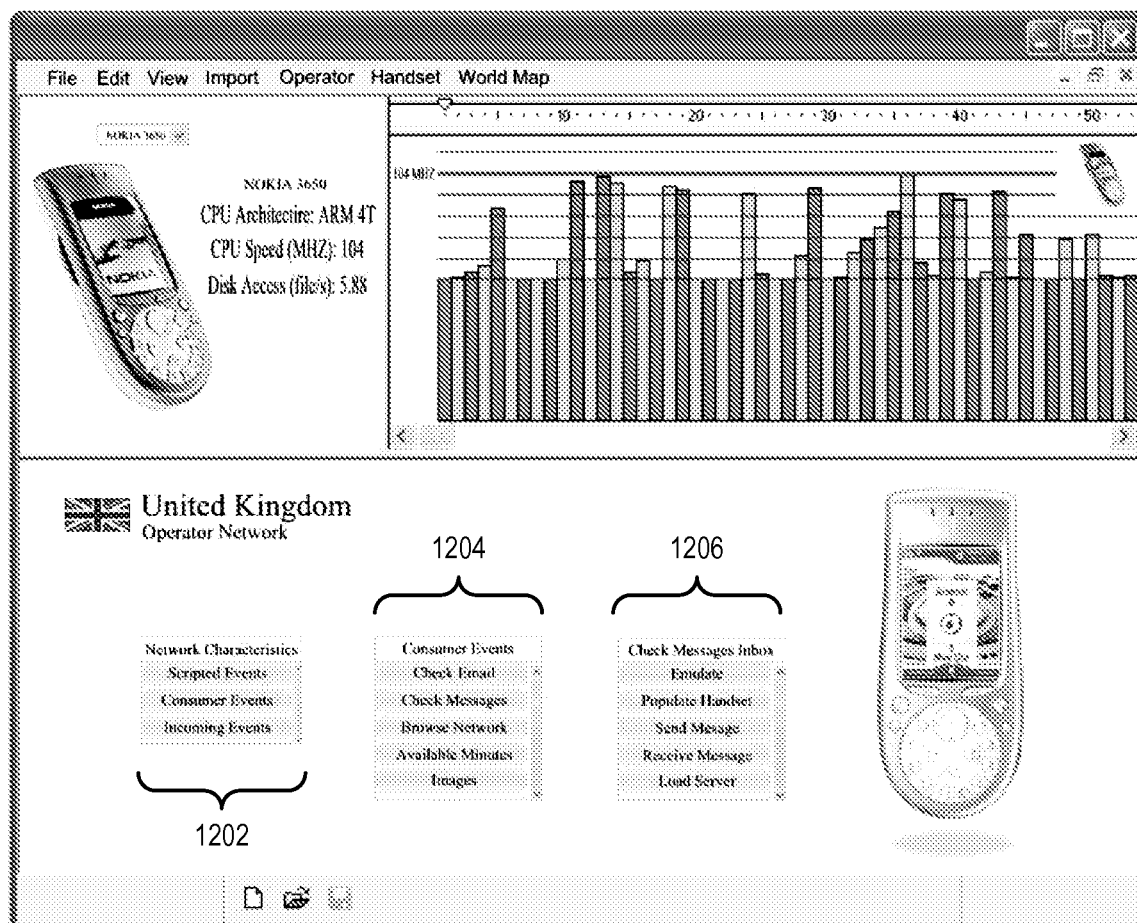

Upon selection of an operator within pull-down list 1004, emulator 101 displays a pull-down list 1104 of mobile devices supported by the selected operator, as shown in window 1100 of FIG. 11. Alternatively, the use may select the menu item 1102 to display list 1104. Upon selection of a mobile device from list 1104, window 1200, FIG. 12, is displayed to allow the user to select desired network characteristics for simulation.

Window 1200 shows a pull-down list 1202 of network characteristics that may be simulated by simulator 810. For example, simulator 810 may allow control of scripted events (e.g., cell tower identification, service message, bandwidth, etc.), consumer events (e.g., checking email, checking messages, browsing network, available minutes, selecting images, etc.) and incoming events (e.g., phone calls, WAP Messages, receiving MMS, receiving SMS, etc.). Based upon selection from list 1202, a second list may be presented to allow further simulation requirements to be entered. In the example of window 1200, consumer events entry of list 1202 was selected, resulting in display of pull-down list 1204 from which check messages was selected resulting in the display of pull-down list 1206. In this example, the user may select 'send message' from list 1206 to evaluate the performance of application 104 while a message is received from the network.

In one embodiment, maps 904, 908 and lists 1004, 1104, 1202, 1204 and 1206 are based upon information received by operator interface 802 from one or more operator development servers 808. Thus, functionality of model 102 and selectable simulations of simulator 810 may be easily updated by the operator as new mobile devices are created without requiring updates to software of emulator 101.

Optionally, the user may select menu item 901, FIG. 9, to immediately locate, download and import modeling characteristics into emulator 101. These characteristics may be stored within storage 134 of computer 130, FIG. 1B.

Figure 13:
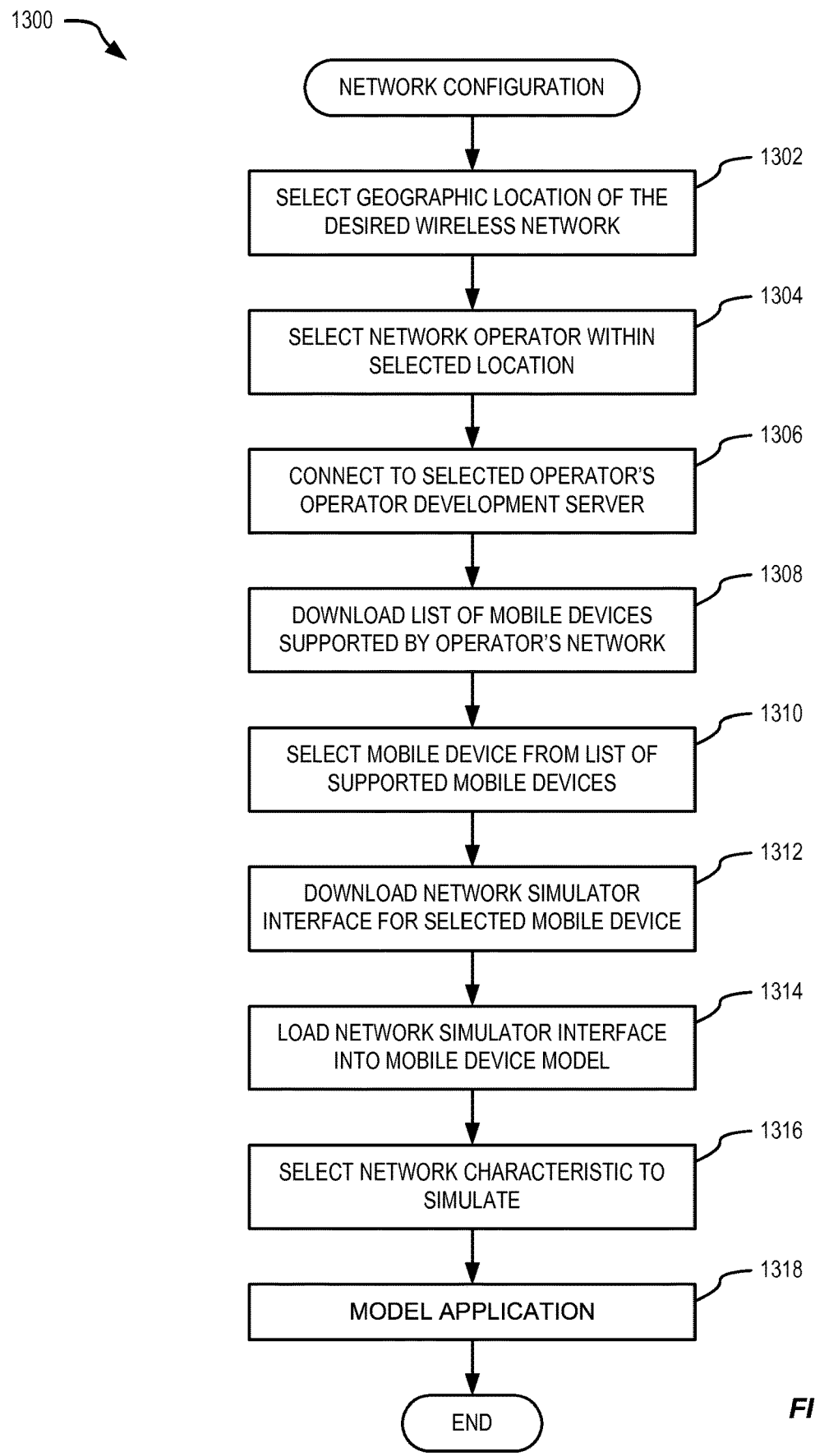
FIG. 13 is a flowchart illustrating one exemplary method for configuring network simulation.

FIG. 13 is a flowchart illustrating one exemplary method 1300 for configuring wireless network simulation.

In step 1302, method 1300 selects a geographic location of the wireless network. In one example of step 1302, emulator 101 displays window 900 and the user selects the United Kingdom as the wireless network location.

In step 1304, method 1300 selects a network operator from within the selected location. In one example of step 1304, emulator 101 displays window 1000 including pull-down list 1004 of network operators within the location selected in step 1302.

In step 1306, method 1300 connects to the selected network operator's development server. In one example of step 1306, emulator 101 utilizes operator interface 802 to connect to operator development server 808 based upon the operator selected in step 1304.

In step 1308, method 1300 downloads a list of mobile devices supported by the simulator of the operator selected in step 1304. In one example of step 1308, emulator 101 downloads characteristic data 815 from server 808 to determine mobile devices supported by simulator 810 and populates list 1104 of window 1100. Of note, an operator may add functionality to simulator 810 based upon a new mobile device prior to supporting the device within the operator's wireless network, thereby encouraging development of applications for the new device before its launch, increasing operator and/or author revenues.

In step 1310, method 1300 selects a mobile device from the list of supported mobile devices. In one example of step 1310, the user selects a mobile device for emulation from list 1104 of window 1100. In another example, where the user has already selected a mobile device from pull-down list 502, emulator 101 automatically selects the same device, if available, from list 1104.

In step 1312, method 1300 downloads a network simulator interface for the selected mobile device. In one example of step 1312, emulator 101 instructs operator interface 802 to download network simulator interface 804 from server 808.

In step 1314, method 1300 loads the network simulator interface into the mobile device model. In one example if step 1314, emulator 101 loads network simulator interface 804 into model 102.

In step 1316, method 1300 selects network characteristics to simulate. In one example of step 1316, the user utilizes lists 1202, 1204 and 1206 of window 1200 to specify network characteristics for simulation by simulator 810.

In step 1318, method 1300 models the application running within a mobile device connected to a wireless network. In one example of step 1318, model 102 interacts with simulator 810 via network simulator interface 804 and internet 822 while playing application 104 and displaying profile window 110.

In one embodiment, the user may purchase and download simulator 810 from operator development server 808 to facilitate local simulation of the wireless network (i.e., without utilizing Internet 822). In this embodiment, simulator 810 may operate within emulator 101, within authoring environment 122 or within computer 130 to provide interaction with model 102.

Emulator 101 may utilize operator interface 802 to interact with one or more operator development servers 808 to download characteristics (e.g., characteristic data 815) and modeling data (e.g., model data 820) for generating mobile device model 102. As new mobile devices are made available, each application author (i.e., user) is able to download these modeling characteristics and test applications for the new mobile device. As mobile devices become more sophisticated and include additional hardware and functionality, emulator 101, though a subscription service with an operator, for example, may download this additional functionality for use in model 102. These characteristics (e.g., characteristic data 815) may include bitmaps, characteristics handset profiles, modeling algorithms, complete mobile device models, bandwidths etc. thereby automatically updating functionality of authoring environment 122. Wireless network operators participate by updating their development servers (e.g., development servers 808) to provide the latest emulation information and functionality for each supported mobile device (e.g., mobile phone handset) and by updating their network simulators (e.g., simulator 810) to includes functionality and/or proposed functionality of their wireless networks.

Application authors (e.g., users of emulator 101) are provided with a visual authoring environment in which the authored application may be emulated as operating within one or more modeled mobile devices (that are optionally connected to a simulated wireless network) without leaving the authoring environment.

The emulator (e.g., emulator 101) may be provided as part of the authoring environment, or as an add-on to an existing development tool.

In an embodiment, characteristics for each mobile device to be emulated are downloaded from a server for a determined price or subscription fee. Since new mobile devices are continually being produced, application authors continually require new modeling characteristics to be able to test their applications. For example, a subscribed charge of $10-15 dollars per handset saves each developer from purchasing a mobile device ($100-200 dollars) and alleviates the need to travel to a wireless network location when testing each mobile device. Thus, the wireless network operator may receive revenue from developers by providing the developers with online network simulation capability. The application authors, via the Internet, are then able to test applications for mobile devices running on wireless networks worldwide.

Characteristics for each mobile device to be emulated may be downloaded from a server for a determined price, licensing or subscription fee. It is estimated that nearly 700 million new mobile devices will be shipped in 2005, with a new handset model being launched every other day. This rapid mobile device development requires that applications designed to run on these mobile devices also sustain rapid development. Development systems targeted at one mobile device may become obsolete and possibly of little value to the developer at the time it is shipped. Since a new mobile device is being launched every other day, application authors continually require purchasing all addressable targeted devices prior to consumer release. For example, a charge of $10-15 dollars per modeled handset would save each developer purchasing each target mobile device ($100-200 dollars) as well as alleviating the need to travel to a wireless network location whilst testing each mobile device before public release, two substantial development and release costs.

During development of an application for a mobile device, an application author may transfer and play the application hundreds of times (development life cycles) on the targeted mobile device before identifying and correcting all system resource problems within the application. Live server and profile updates would substantially reduce and alleviate a high churn rate of development life cycles, enabling a more cost effective authoring model for the developer. As well, although the purchase of a 'static' PC authoring environment may become obsolete due to the ongoing release of new mobile handsets (the target release platform) emulator 101 and operator development server 808 maintains a live and continually updatable business model and authoring platform long after the initial authoring platform has released to the market.

Figure 14:
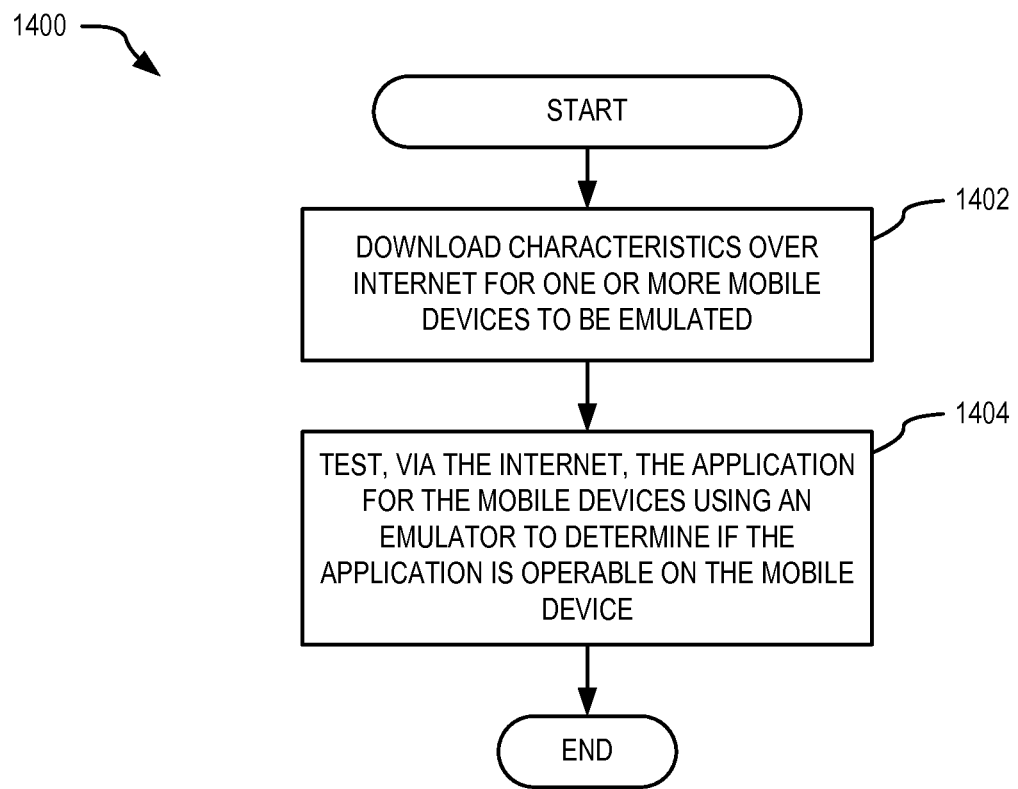
FIG. 14 is a flowchart illustrating one method for determining whether a frame-based application of a mobile device is operable.

FIG. 14 is a flowchart illustrating one method for determining whether an application of a mobile device is operable. In step 1402, method 1400 downloads characteristics over Internet for one or more mobile devices to be emulated. In step 1404, method 1400 tests the application for the mobile devices, via the Internet, using an emulator to determine if the application is operable on the mobile device.

Figure 15:
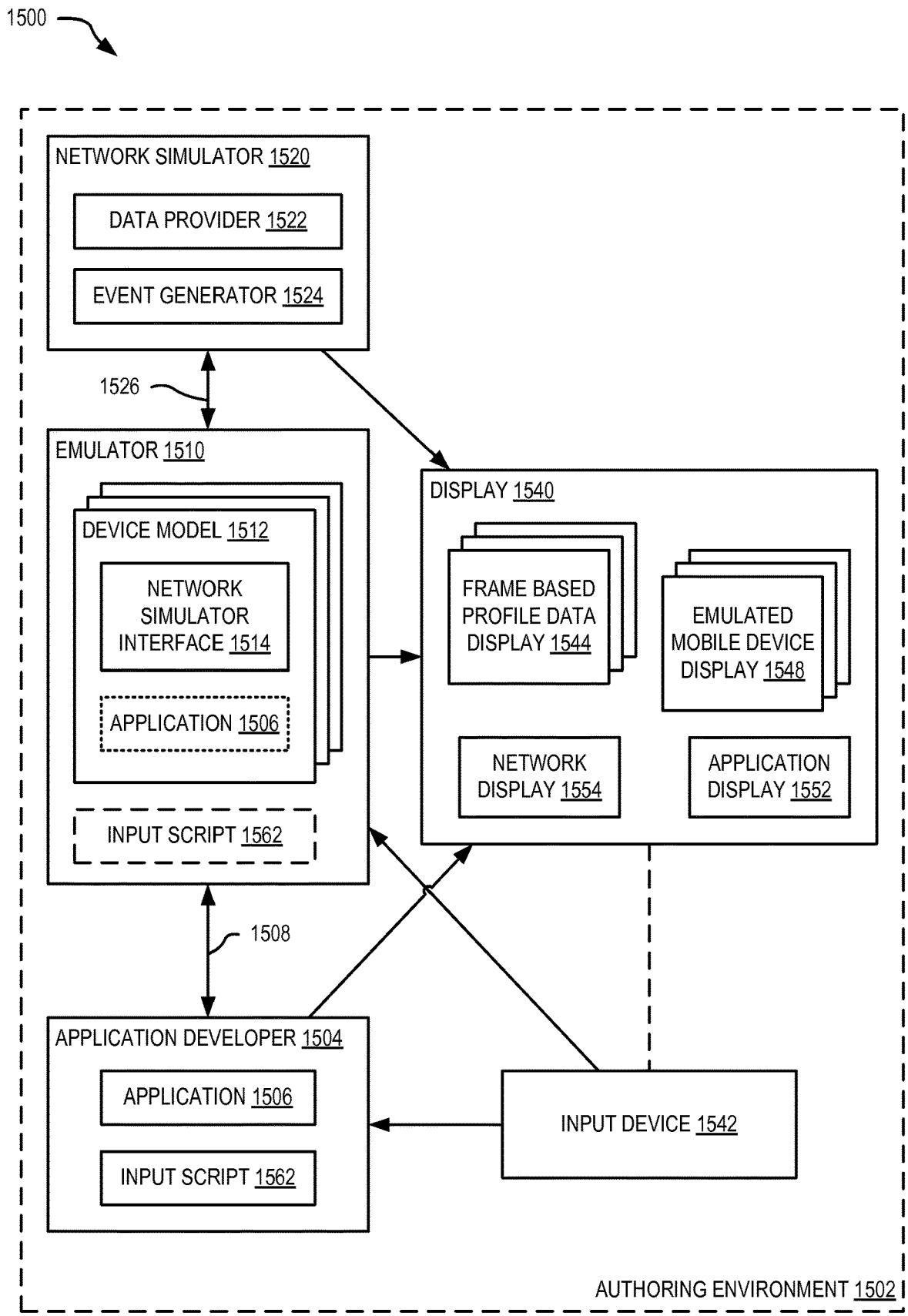
FIG. 15 shows one exemplary authoring environment for emulating and profiling running of a frame-based application on multiple mobile devices.

FIG. 15 shows one exemplary authoring environment 1502 for emulating and profiling running of a frame-based application 1506 on multiple mobile devices. Authoring environment 1502 includes a display 1540 and an input device 1542 that allow a user to interact with authoring environment 1502. Display 1540 may represent one or more computer displays and input device 1542 may represent one or more input devices such as keyboard, mouse, graphic tablet, etc. In one embodiment, display 1540 and input device 1542 are combined in the form of a touch screen. Authoring environment 1502 also includes an application developer 1504 (e.g., Flash MX for Flash Lite applications, xCode and Instruments for Apple applications, and Android for Google applications) that is used to create and/or modify application 1506. The user interacts with application developer 1504, via input device 1542 and display 1540, to create an application 1506. Application 1506 is, for example, a Flash Lite application for use on a mobile device running a Flash Lite environment, or an Android application for use on a mobile device implementing Android.

Authoring environment 1502 also includes an emulator 1510 and one or more device models 1512 for emulating operation of one or more mobile devices to allow the user to test operation of application 1506 on each device. Emulator 1510 may output, to display 1540, one or more frame-based profile data displays 1544 and one or more emulated mobile device displays 1548. Displays 1544 and 1548 are for example shown within windows and/or frames on display 1540.

Authoring environment 1502 may also include a network simulator 1520 that simulates a service provider network and interacts 1526 with one or more emulated device models 1512. Network simulator 1520 includes a data provider 1522 that provides data to device models 1512 and an event generator 1524 that generates network events to simulate connection of device models 1512 to a real service provider network. That is, data and events of the real network are simulated by network simulator 1520.

Application developer 1504, emulator 1510 and network simulator 1520 may each be a part of authoring environment 1502, or may each be an external software program that is configured to cooperate with components of authoring environment 1502. That is, authoring environment 1502 may incorporate one or more software programs to facilitate creation, modification and testing of application 1506.

In one example of operation, the user creates and/or edits application 1506 by interacting with application developer 1504 via display 1540 and input device 1542. Application 1506 is then loaded into one or more selected device models 1512 and one or more frame-based profile data displays 1544 and emulated mobile device displays 1548 are shown on display 1540. If, during running of application 1506 on emulated device model 1512, a problem or optimization is identified, the user may modify application 1506 using application developer 1504. In one example, the user interacts with application developer 1504 to modify application 1506, which then, through cross pollination 1508, updates each device model 1512. That is, application 1506 is updated within each device model 1512 automatically such that changes to application 1506 within application developer 1504 are duplicated within each device model 1512.

In another example of operation, the user modifies application 1506 within device model 1512 by interacting with one or more of frame-based profile data displays 1544 and/or emulated mobile device displays 1548. The user may select a frame of application 1506 to edit by manipulating a current position indicator (e.g., position indicator 306, FIG. 3). Authoring environment 1502, through cross pollination 1508, automatically updates application 1506 within application developer 1504 and application 1506 within any other device model 1512, such that each application 1506 within authoring environment 1502 remains 'current'.

In another example of operation, the user emulates multiple device models 1512 within emulator 1510 to test application 1506 within each device model 1512 simultaneously. Emulator 1510, through emulation of device models 1512, identifies problems within application 1506 that are specific to each emulated device model 1512. For example, where CPU and/or memory over utilization of the emulated device model 1512 occurs when running application 1506, device model 1512 and/or emulator 1510 identifies the location (i.e., frame) within application 1506 of such over utilization problems and they are reported to the user within frame-based profile display data 1544 (and optionally other summary displays generated by emulator 1510).

Emulator 1510 may operate such that emulated mobile device display 1548, network display 1554 and application display 1552 for each emulated device model 1512 appears to operate substantially in real time (i.e., as if application 1506 is actually running on the mobile device being emulated). More specifically, emulator 1510 may provide runtime profiling of real time mobile device resource utilization by application 1506 to produce frame based profile data display 1544, emulated mobile device display 1548, network display 1554 and application display 1552.

Where emulator 1510 emulates more than one device model 1512, these device models may be synchronized at an application frame level. That is, for each device model 1512, the currently frame of application 1506 within each frame based profile data display 1544, emulated mobile device display 1548, network display 1554 and application display 1552, is the same. Further, interaction with any one of frame based profile data display 1544, emulated mobile device display 1548, network display 1554 and application display 1552, of any device model 1512, may automatically be propagated to any other device model 1512 running within emulator 1510.

A user may interact with one or more of frame based profile data displays 1544 of device model 1512 to modify resources available to application 1506. For example, the user may interactively adjust a resource capacity line (e.g., capacity line 308, FIG. 3) of one or more of frame based profile data displays 1544 to control the resource amount available to application 1506 within the associated device. In particular, a user may move a processor resource capacity line up to increase the available processor resource above that defined for the emulated mobile device. For example, the user may increase the available processor resources to pass a processor intensive frame within application 1506, thereby allowing evaluation of frames within application 1506 beyond a point where application 1506 would otherwise crash. In another example, the user may decrease a memory resource available to application 1506 (e.g., by lowering the memory capacity line within the memory display 1544) in order to 'stress test' application 1506.

Emulator 1510 may also emulate device models 1512 at speeds other than real time. For example, a user of application developer 1504 and emulator 1510 may elect to emulate device model 1512 at half speed during testing of at least part of application 1506. Alternatively, where application 1506 is being tested for operability on a plurality of mobiles devices, the user may elect to emulate device models 1512 as fast as possible. In one example, the user may define one or more input scripts 1562 for use with application 1506 such that user interaction with each device model 1512 is not required unless resource utilization is exceeded by application 1506 for that model. For example, input scripts 1562 may predefine user interaction at defined frames of application 1506.

In an embodiment, when all of frame based profile data display 1544, emulated mobile device display 1548, network display 1554 and application display 1552 of a first device model 1512 are minimized (i.e., not currently displaying content within display 1540), input made to any other device model 1512 is automatically propagated to that first device model 1512.

In an alternate embodiment, each device model 1512 operates, within emulator 1510, independently of any other device model 1512, allowing the user to interact with (or define an input script for) each device model 1512 independently.

Figure 16:
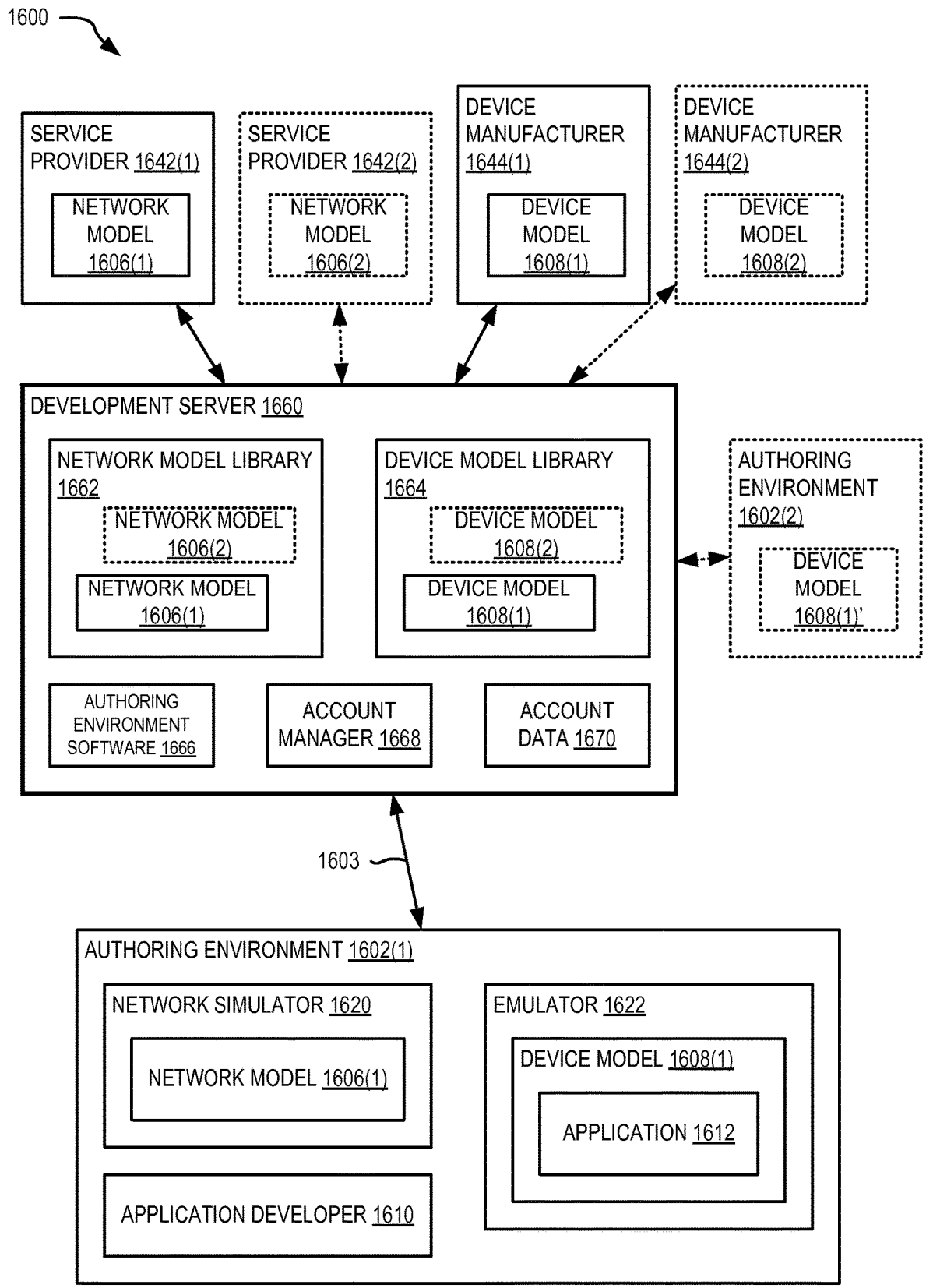
FIG. 16 shows one exemplary development scenario illustrating an authoring environment connecting to a development server to retrieve and utilize one or more network models and one or more device models.

FIG. 16 shows one exemplary development scenario 1600 illustrating an authoring environment 1602 connecting to a development server 1660 to retrieve and utilize one or more network models 1606 and one or more device models 1608. Authoring environment 1602 may represent authoring environment 1502, FIG. 15, and authoring environment 122 and include similar functionality. Development server 1660 may represent development server 808, FIG. 8, and include similar functionality. Authoring environment 1602 and development server 1660 may include additional functionality, as described below.

At least one service provider 1642(1) generates a network model 1606(1) based upon characteristics of a real network service of service provider 1642(1). Service provider 1642(1) provides network model 1606(1) to development server 1660 where it is stored within a network model library 1662. Development server 1660 may receive other network models (e.g., network model 1606(2)) from other service providers (e.g., service provider 1642(2)), each of which may be stored within network model library 1662.

A device manufacturer 1644(1) generates a device model 1608(1) based upon a mobile device developed by device manufacturer 1644(1). That is, device model 1608(1) is designed to emulate characteristics of the mobile device. Device manufacturer 1644(1) provides device model 1608(1) to development server 1660 where it is stored within a device model library 1664. Development server 1660 may receive other device models (e.g., device model 1608(2)) from other device manufacturers (e.g., device manufacturer 1644(2)), each of which may be stored within device model library 1664. Further, an author using authoring environment 1602(2) may also submit new and/or amended device models (e.g., device model 1608(1)') to development server 1660 for use by authors and authoring environments 1602. Development server 1660 may employ one or more techniques for managing updates to network model library 1662 and device model library 1664 to prevent unauthorized changes.

Development server 1660 may also store authoring environment software 1666 for download by a user to create or update an authoring environment 1602. In one example of operation, the user logs into an account manager 1668 of development server 1660 that, upon validation of the user using account data 1670, allows the user to download authoring environment software 1666 and one or more network models 1606 and/or one or more device models 1608, based upon a subscription status of the user. Account manager 1668 may store account information of the user within account data 1670 that includes subscription status for accessing development server 1660. At a first subscription level, the user subscribes to development server 1660 to access authoring environment software 1666, and any updates thereto. At a second subscription level, the user subscribes to device model library 1664, and any updates thereto. At a third subscription level, the user subscribes to network model library 1662, and any updates thereto. These subscriptions may be based upon time, e.g., a monthly subscription fee, or may be based upon a number of accesses (e.g., the user may download X network models 1606 and Y device models 1608, where the user has prepaid for X network models and Y device models).

Development server 1660 provides a single source for obtaining development tools for creation and/or modification of application 1612 and allows the user to retrieve the latest models from device manufacturers 1644 and service providers 1642. In certain embodiments, authoring environment 1602 is configured to automatically obtain the latest software and models, as they become available, based upon the user's subscription (or upon paid fees) to development server 1660.

Figure 17:
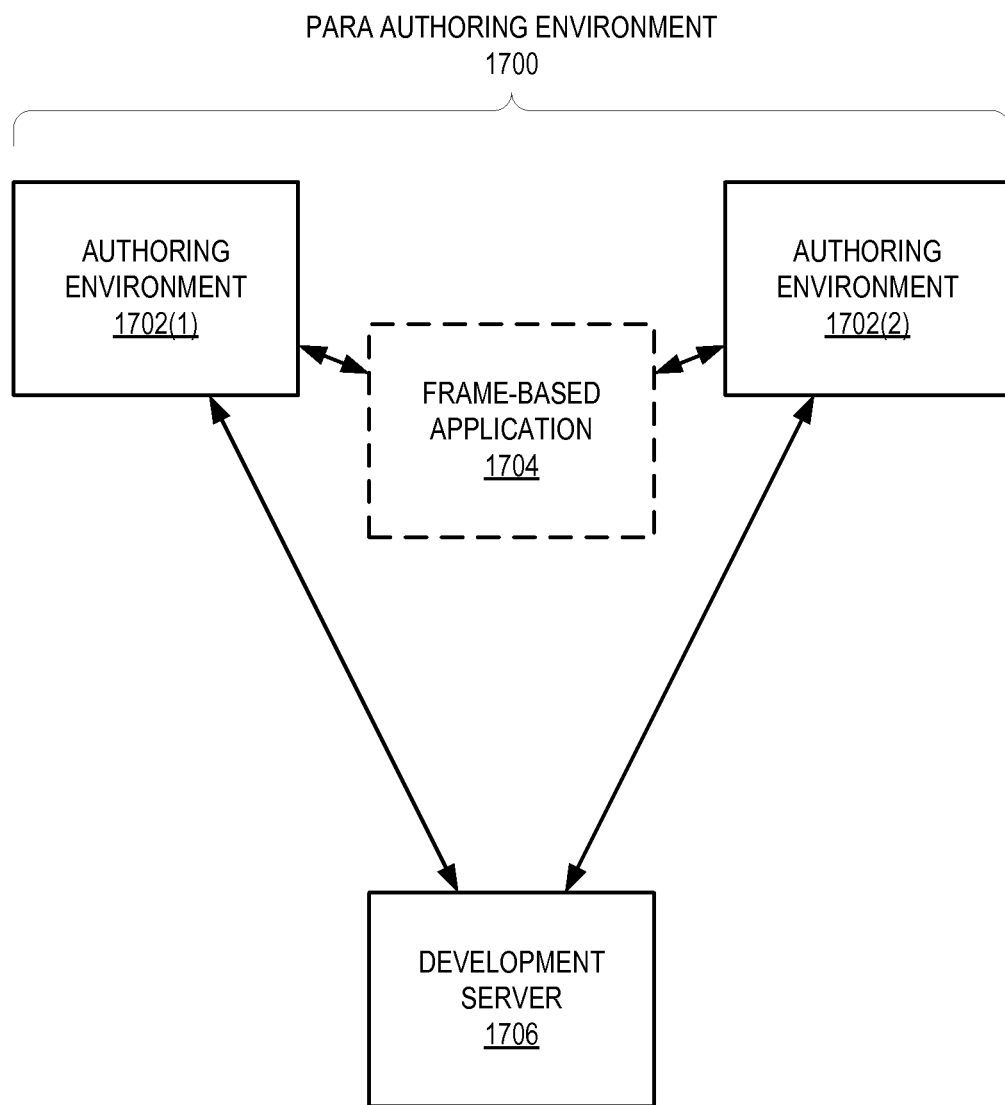
FIG. 17 shows one exemplary para-authoring environment wherein two application authoring environments cooperate to develop a frame-based application for a mobile device.

FIG. 17 shows one exemplary 'para-authoring' environment 1700 wherein two application authors use authoring environments 1702(1) and 1702(2) to cooperate to develop a frame-based application 1704 for a mobile device. For the purposes of the present document, the term 'para-authoring' is defined as the simultaneous or near-simultaneous collaborative authoring of a particular application by more than one author. In the present system, para-authoring may be performed via an Internet connection between two or more sites, or locally in a desktop/online environment. Authoring environments 1702 may represent authoring environment 1602, FIG. 16, as well as the authoring environments shown in FIGS. 9 through 12, as they relate to one or more developers authoring a frame based application, and may include similar functionality. Authoring environments 1702 may include additional functionality, as described below.

Authoring environments 1702(1) and 1702(2) may each be used to develop a subsection of frame-based application 1704 and cooperate, through facilities of development server 1706 to combine and test these parts as one application 1704. Authoring environments 1702 may be located anywhere providing that communication with development server 1706 is possible. That is, authoring environments 1702 need not be located proximate to one another to be able to provide para-authoring environment 1700.

Figure 18:
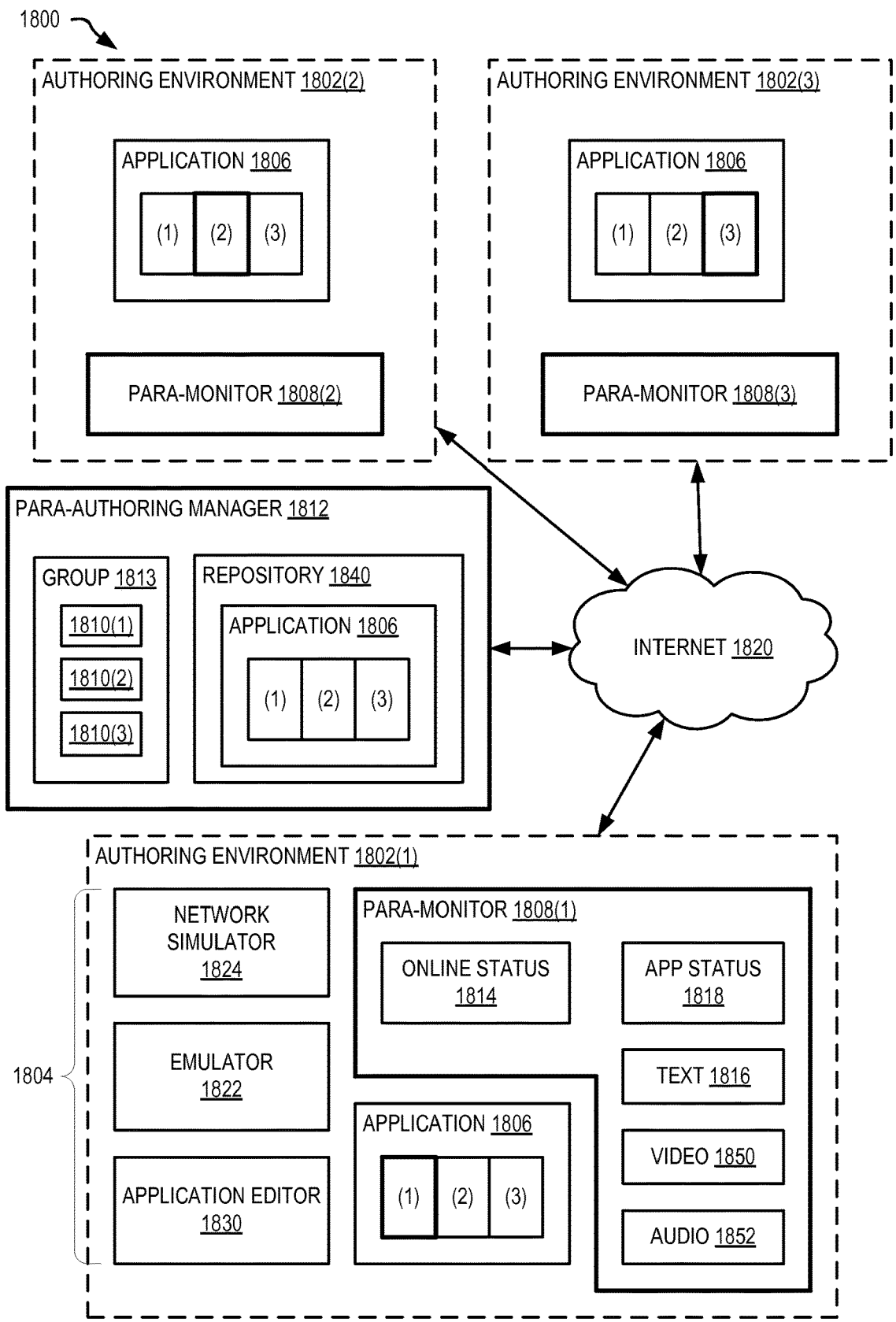
FIG. 18 shows one exemplary para-authoring system illustrating presence and social interaction between three authoring environments.

FIG. 18 shows one exemplary para-authoring system 1800 illustrating presence and social (collaborative) interaction between three authoring environments 1802. Each authoring environment 1802 includes a suite of development tools 1804 that facilitate development of a frame-based application 1806 that is formed of subsections (labeled (1), (2) and (3) in this example, although application 1806 may include more or fewer subsections of varying sizes without departing from the scope hereof). For example, application 1806 may include a background section, a foreground section, a menu section, and a data section, each of which may be authored within a different authoring environment. In the example of FIG. 18, three authoring environments cooperate to develop frame-based application 1806. In particular, of application 1806, subsection (1) is developed within authoring environment 1802(1), subsection (2) is developed within authoring environment 1802(2), and subsection (3) is developed within authoring environment 1802(3). However, for complete application evaluation, certain or all subsections of application 1806 may be loaded into each authoring environment 1802 as they are made available (i.e., published) by the respective authoring environment.

Each authoring environment 1802 includes a para-monitor 1808 that publishes status information 1810 indicating activity of that authoring environment to a para-authoring manager 1812. For example, para-monitor 1808(1) publishes status information of authoring environment 1802(1), para-monitor 1808(2) publishes status information of authoring environment 1802(2), and para-monitor 1808(3) publishes status information of authoring environment 1802(3); each of para-monitors 1808(1), 1808(2) and 1808(3) sending status information 1810(1), 1810(2) and 1810(3), respectively, to para-authoring manager 1812.

Para-authoring manager 1812 operates to receive published online status 1814 from para-monitor 1808 and maintains a group 1813 association of related status information 1810. Group 1813 in this example is identified as associating authoring environments 1802(1), 1802(2) and 1802(3). Para-authoring manager 1812 may store other groups with more or fewer associations, without departing from the scope hereof. That is, manager 1812 maintains presence information of authoring environments 1802. In one embodiment, manager 1812 is located on a development server (e.g., development servers 1660 and 1706). Para-authoring manager 1812 may also include a repository for storing sections of application 1806 to facilitate retrieval by associated authoring environments 1802. In another embodiment, para-authoring manager 1812 is located within one of authoring environments 1802.

Para-monitor 1808, within each authoring environment 1802, receives (either by request or by a 'publish on change' mechanism-push) published status information 1810 of associated authoring environments 1802, and displays this status information as one or both of online status 1814 and application status 1818 within authoring environment 1802. For example, para-monitor 1808(1) may display status of authoring environments 1802(2) and 1802(3) and availability of associated sections of application 1806. Para-monitor 1808 may also provide other communication facilities, such as, but not limited to, one or more of video conferencing facilities 1850, audio conferencing facilities 1852, and text communication facilities 1816.

More specifically, para-monitor 1808 may publish status information on one or more of network simulator 1824, emulator 1822 and application editor 1830 (collectively development tools 1804), thereby allowing para-authors using associated (grouped) authoring environments 1802 to receive status of associated development of application 1806.

Figure 19:
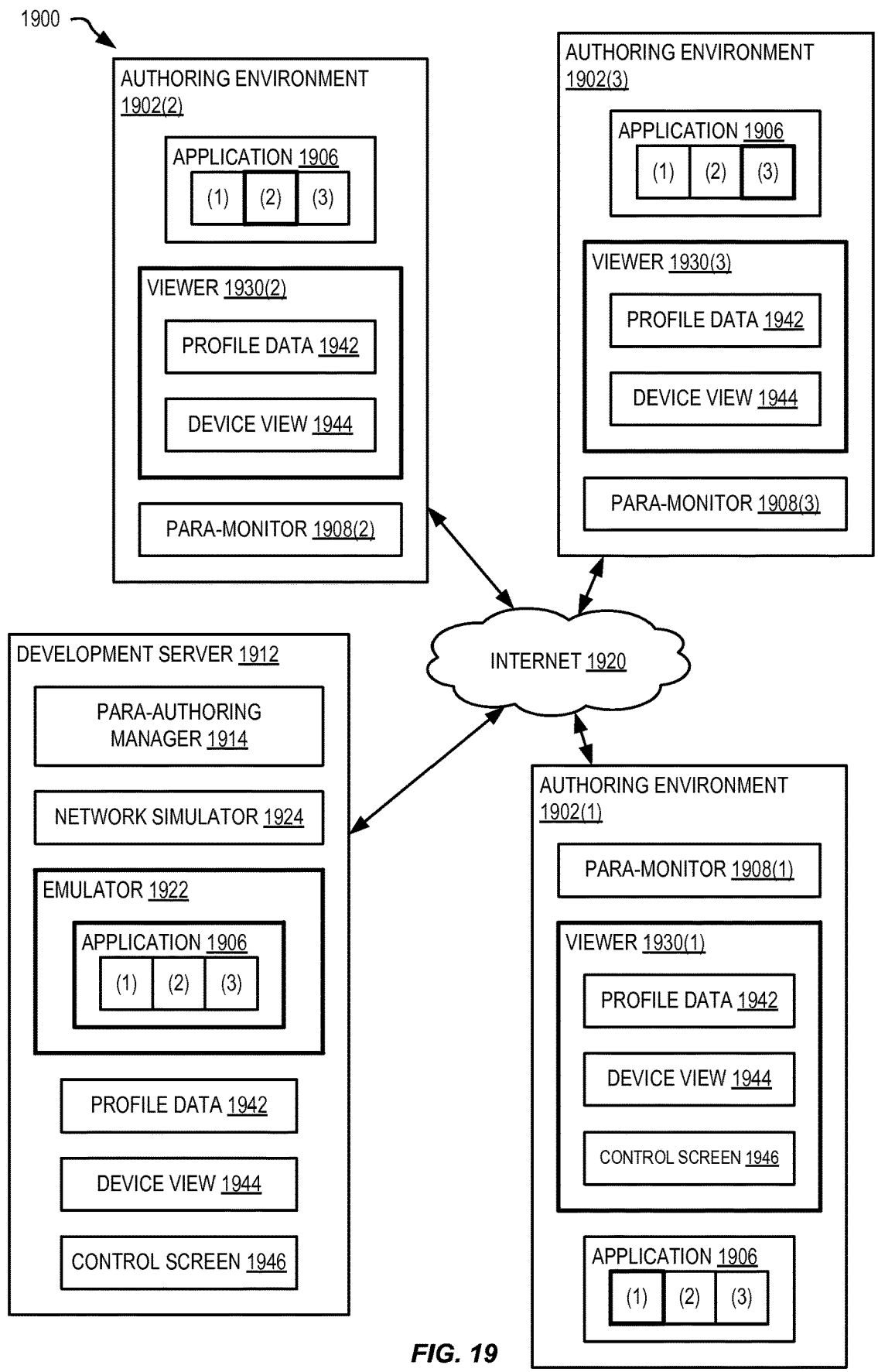
FIG. 19 shows one exemplary para-authoring system wherein a frame-based application is developed across three cooperating authoring environments.

FIG. 19 shows one exemplary para-authoring system 1900 wherein a frame-based application 1906 is developed across three cooperating authoring environments 1902(1), 1902(2) and 1902(3). A development server 1912 includes a para-authoring manager 1914, a network simulator 1924 and an emulator 1922. Development server 1912 may represent development server 1660 of FIG. 16 and include functionality of development server 1660. Para-authoring manager 1914 may represent para-authoring manager 1812 of FIG. 18 and include functionality of para-authoring manager 1812. Network simulator 1924 and emulator 1922 may represent network simulator 1620 and emulator 1622, respectively, and include similar functionality. Authoring environment 1902 may represent authoring environment 1602 and authoring environment 1802 of FIG. 18 and include similar functionality.

Each authoring environment 1902 is used to develop a section of application 1906. Authoring environments 1902 each include a viewer 1930 that operates to view application 1906 playing on an emulated mobile device within emulator 1922 of development server 1912, described in further detail below. Viewer 1930 may represent a web browser where output of emulator 1922 is in the form of an interactive web page.

Through collaborative development (or 'social networking'), users of authoring environments 1902 are aware of other para-authors' activities and may cooperatively view testing of application 1906. Development server 1912, under control of authoring environment 1902, loads application 1906 into emulator 1922 where it is profiled running on a model (e.g., device model 102, FIGS. 1A, 1B, 2, and 8, 1512, FIGS. 15, and 1608, FIG. 16) of a mobile device. In particular, emulator 1922 generates profile data 1942 and device view 1944 based upon the emulated application and selected device model. Profile data 1942 includes data defining estimated application utilization of the mobile devices resources, including one or more of: processor resources, memory resources, graphic resources, and networking resources. Profile data 1942 is similar to profile data 152, FIG. 1B, and may be displayed (e.g., within viewers 1930) numerically and/or graphically (e.g., as a graph, such as shown in profile window 110, FIG. 3). Device view 1944 is a graphical representation of application 1906 running within the device model of the mobile device. In particular, device view 1944 shows output of application 1906 on the mobile device and may allow one or more para-authors to interact with application 1906 and/or the emulated mobile device (i.e., the device model). Optionally, the device model interacts with network simulator 1924 to simulate use of the emulated mobile device on a real network. That is, network simulator 1924 interacts with the emulated device model to simulate operation of the mobile device within a real network. Emulator 1922 may also generate a control screen 1946 that allows authoring environment 1902(1) to control operating of emulator 1922 and optionally network simulator 1924. Para-authoring manager 1914 also allows authoring environments 1902(2) and 1902(3) to view, using viewers 1930(2) and 1930(3), respectively, profile data 1942 and device view 1944 during emulation of application 1906.

In one example of operation, authoring environment 1902(1) controls emulator 1922 and network simulator 1924 through control screen 1946 and viewer 1930(1). Para-monitor 1908(1) publishes activity status of environment 1902(1) to para-authoring manager 1914, which in turn updates environments 1902(2) and 1902(3) as to this activity. Environments 1902(2) and 1902(3) may then elect, through para-monitor 1908(2) and 1908(3), to also view profile data 1942 and device view 1944 on viewers 1930(2) and 1930(3), respectively. Para-monitor 1908, as shown with para-monitor 1808 in FIG. 18, may also provide other collaborative communication means, such as video, audio and text communication, that allow users of environments 1902 to communicate during the shared emulation of application 1906. Optionally, for example under control of environment 1902(1), environments 1902(2) and 1902(3) may be allowed to interact with the emulated device model through device view 1944.

In one embodiment, control screen 1946 may be transferred between environments 1902 to allow control of emulator 1922 and network simulator 1924 to be transferred between para-authors. For example, environment 1902(1) may transfer control screen 1946 to environment 1902(2) such that the para-author using environment 1902(2) may control application 1906 within emulator 1922.

Figure 20:
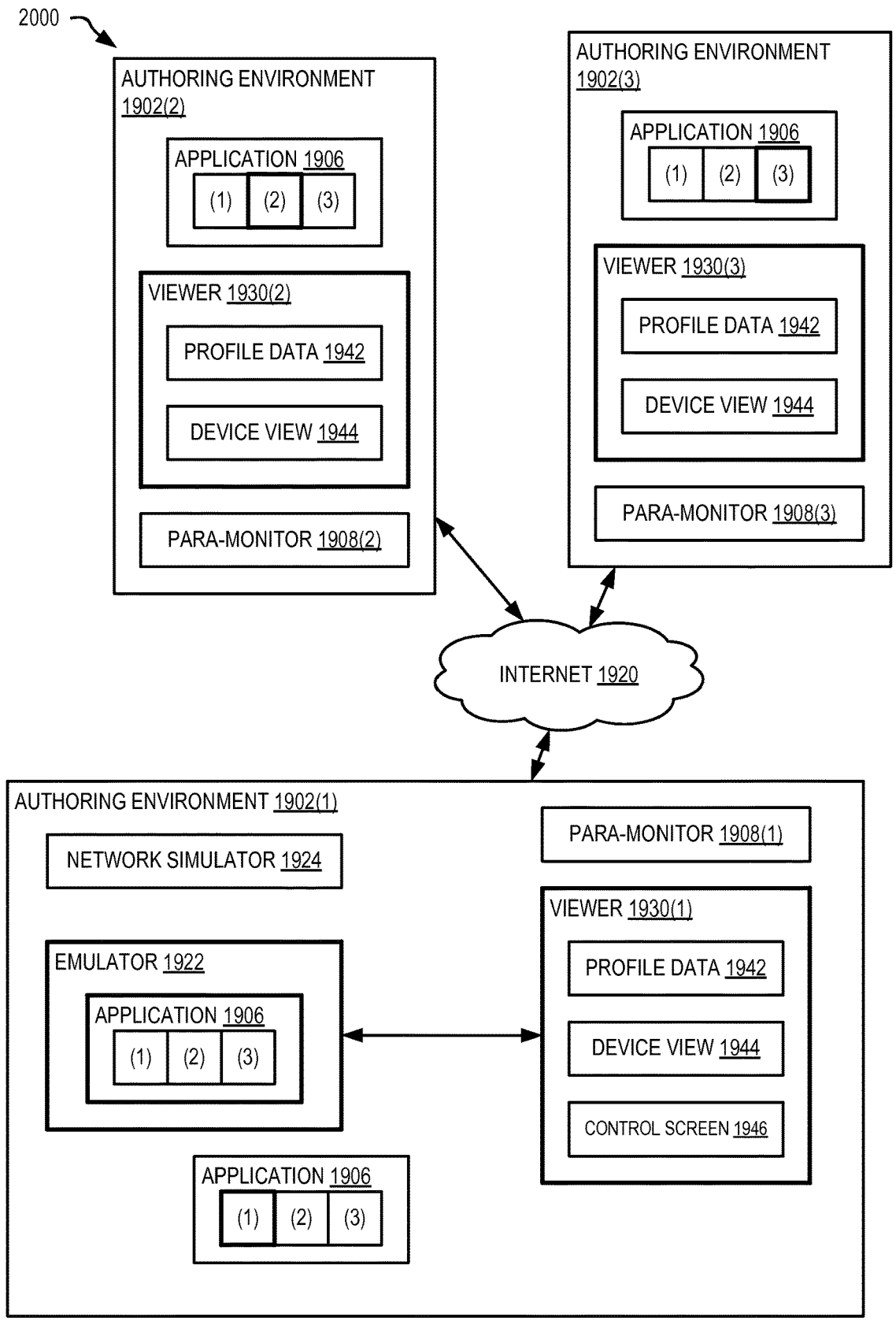
FIG. 20 shows the para-authoring system of FIG. 19 wherein the authoring environment includes the emulator and the network simulator to host emulation of the application.

In an alternate embodiment, shown in FIG. 20, authoring environment 1902(1) includes emulator 1922 and network simulator 1924, and hosts emulation of application 1906. FIG. 20 shows para-authoring system 1900 wherein an application 1906 is developed across three cooperating authoring environments 1902(1), 1902(2) and 1902(3). More or fewer para-authoring environments may cooperate without departing from the scope hereof. Para-monitor 1908 (1) publishes activities of environment 1902 (1) to para-monitor (1908(2) and 1908(3), such that para-authors using environments 1902(2) and 1902(3) may selectively view emulation of application 1906 via internet 1920. In particular, para-monitors 1908 may cooperate to form one or more direct peer-to-peer communication links between environments 1902 to allow profile data 1942 and device view 1944 to be viewed within authoring environments 1902(2) and 1902(3). Para-monitor 1908 may still operate with para-authoring manager 1914 to determine communication configuration possibilities, but providing direct peer-to-peer communication links between environments 1902 may allow faster data transfer between environments and avoid overload of development server 1912.

Figure 21:
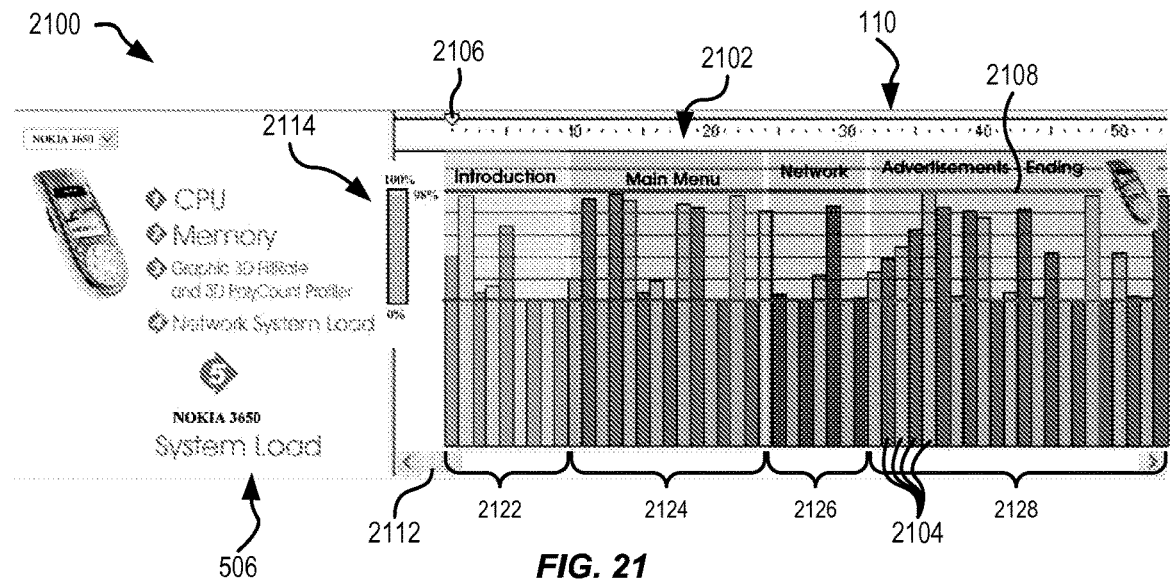
FIG. 21 shows an exemplary display illustrating profiled data that combines CPU, memory, graphics, and network utilization.

FIG. 21 shows one exemplary display 2100 illustrating a display of profiled data 152, that combines CPU, memory, graphics, and network utilization as determined by processor profile module 202, memory profile module 204, graphic profile module 206, and system profile module 208. In particular, display 2100 is shown with a time line 2102 that represents timeline 222 of application 104. In this example, each bar 2104 indicates total resource utilization for each of certain frames 223 of application 104. Each bar 2104 may, alternatively, represent a particular point or period in time during the execution of the application 104. Bars 2104 are displayed prior to execution of the application to indicate a pre-execution profile of the program. During the playing of application 104 within model 102, a current position indicator 2106 shows the frame (i.e., frame 1 in this example) currently displayed by emulated mobile device display 111. A capacity line 2108 indicates the maximum total resources available to application 104. Where bars 2104 rise above capacity line 2108, resource utilization for indicated frames of application 104 exceed the available resources of mobile device 114; thus application 104 may 'capout' or crash when playing those frames. Display 2100 also includes a resource utilization level indicator 2114 that shows the total resource utilization for the current frame of application 104 (i.e., as indicated by current position indicator 2106).

Display 2100 illustrates total resource utilization by frames 223 of application 104, thereby facilitating assessment of stresses applied to mobile device 114 when playing application 104. Where the number of frames 223 (displayed as bars 2104) of application 104 exceeds the display capacity of display 2100, a scroll bar 2112 allows the user to scroll through bars 2104 for application 104. The displayed bars 2104 are also shown grouped to indicate different sections, including "Introduction" 2122, "Main Menu" 2124, "Network" 2126, and "Advertisements-Ending" 2128, of application 104. For example, section 2122 represents initial frames of application 104 that correspond to the 'introduction' of an application, i.e., the beginning preamble or introductory material prior to a 'main menu'. In a sports application, for example, the 'introduction' of an application might consist of introducing the corporate sponsors for a given event, including setting up the landscape of the application which leads into the main menu.

Figure 22:
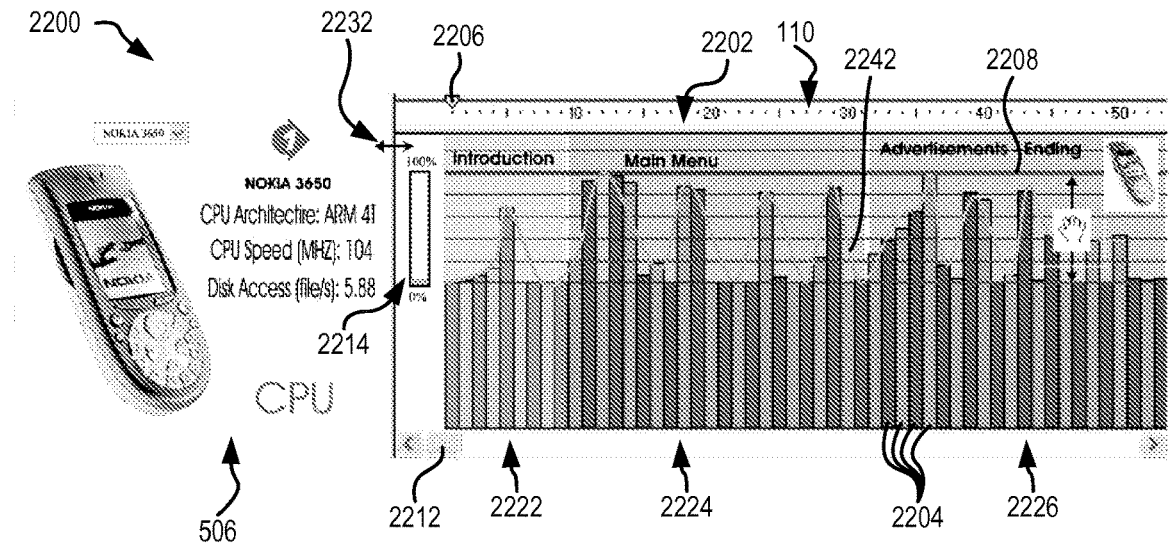
FIG. 22 shows an exemplary display illustrating profiled data for CPU utilization.

FIG. 22 shows one exemplary display 2200 illustrating a frame based display of profiled data 152 for CPU utilization as determined by processor profile module 202. In particular, display 2200 is shown with a time line 2202 that represents timeline 222 of application 104. In this example, each bar 2204 indicates processor resource utilization for certain frames 223 of application 104. During play of application ψwithin model 102, a current position indicator 2206 shows the frame (frame 1 in this example) currently displayed by emulated mobile device display 111 (see FIG. 4A). Capacity line 2208 indicates the maximum processor resource available to application 104. Where bars 2204 rise above capacity line 2208, processor resource utilization for associated frames of application 104 exceed the available processor resources of mobile device 114; thus application 104 may 'capout' or crash when playing those frames. Display 2200 illustrates processor resource utilization by frames 223 of application 104, thereby facilitating assessment of processor stresses applied to mobile device 114 when playing application 104. Where the number of frames 223 of application 104 exceeds the display capacity of display 2200, a scroll bar 2212 allows the user to scroll through bars 2204 for application 104.

The displayed bars 2204 are also shown grouped to indicate different sections (e.g., "Introduction" 2222, "Main Menu" 2224, and "Advertisements Ending" 2226) of application 104. Display 2200 further shows one exemplary line graph 2242 illustrating alternate display options for frames 2204, and the use of a movement tool 2244 to adjust capacity line 2208 and/or the amount of available processor resource.

Figure 23:
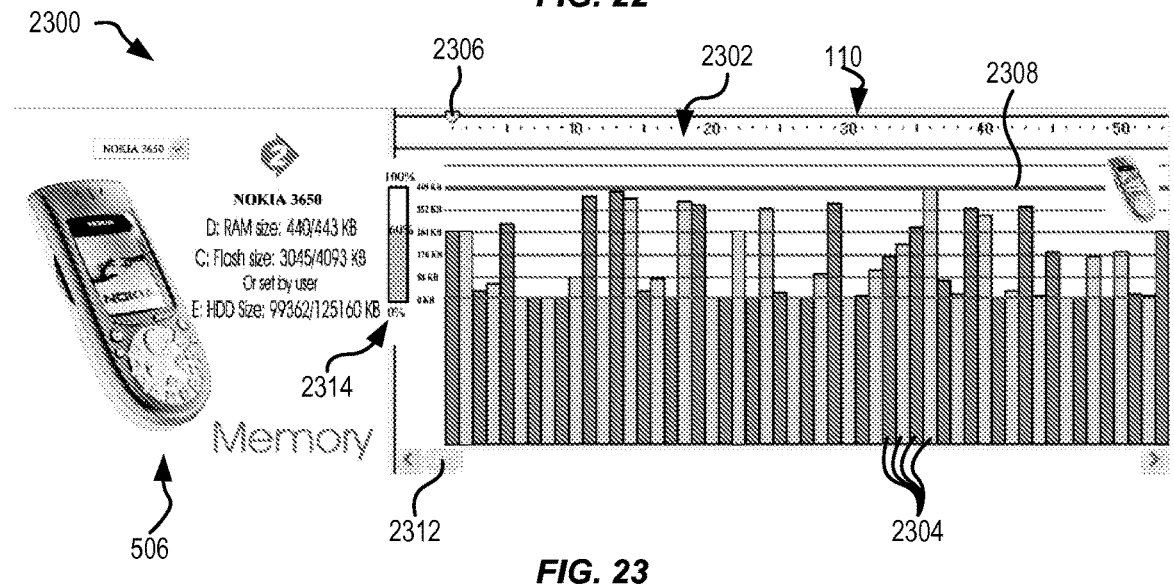
FIG. 23 shows an exemplary display illustrating profiled data for memory utilization.

FIG. 23 shows one exemplary display 2300 illustrating a frame based display of profiled data 152 for memory utilization as determined by memory profile module 204. In particular, display 2300 is shown with a time line 2302 that represents timeline 222 of application 104. In this example, each bar 2304 indicates memory resource utilization for certain frames 223 of application 104. During play of application 104 within model 102, a current position indicator 2306 shows the frame (i.e., frame 1 in this example) currently displayed by emulated mobile device display 111 (see FIG. 4). A capacity line 2308 indicates the maximum memory resources available to application 104. Where bars 2304 rise above capacity line 2308, memory resource utilization for associated frames of application 104 exceed the available memory resources of mobile device 114; thus application 104 may 'capout' or crash when playing those frames. Display 2300 illustrates memory resource utilization by frames 223 of application 104, thereby facilitating assessment of memory stresses applied to mobile device 114 when playing application 104. Where the number of frames 223 of application 104 exceeds the display capacity of display 2300, a scroll bar 2312 allows the user to scroll through bars 2304 for application 104.

Figure 24:
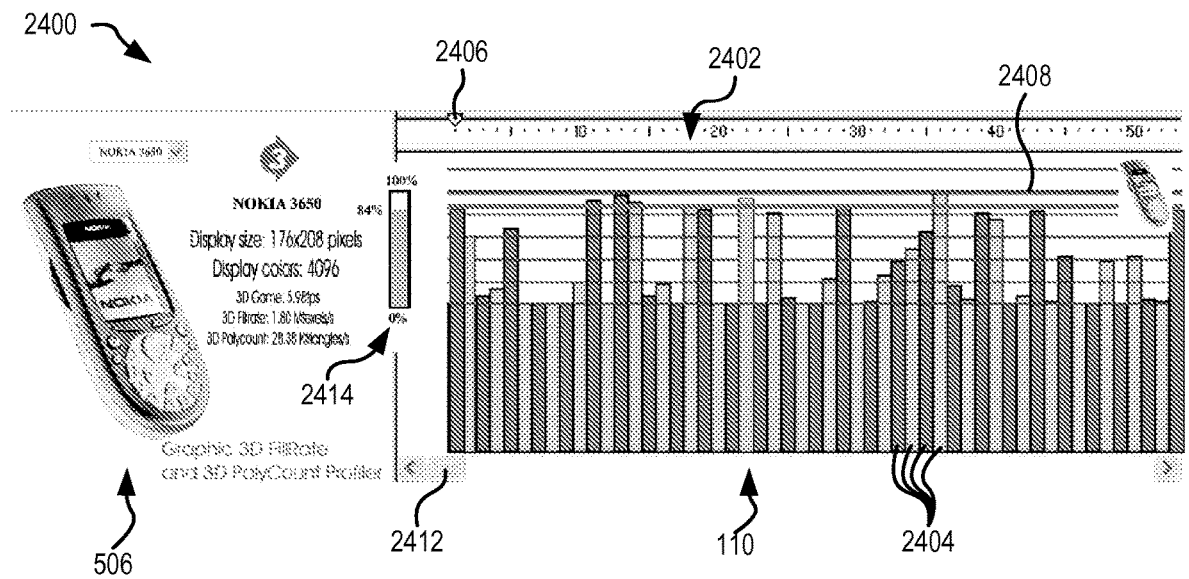
FIG. 24 shows an exemplary display illustrating profiled data for graphic resource utilization.

FIG. 24 shows one exemplary display 2400 illustrating a frame based display of profiled data 152 for graphic resource utilization as determined by graphic profile module 206. In particular, display 2400 is shown with a time line 2402 that represents timeline 222 of application 104. In this example, each bar 2404 indicates graphic resource utilization for certain frames 223 of application 104. During play of application 104 within model 102, a current position indicator 2406 shows the frame (i.e., frame 1 in this example) currently displayed by emulated mobile device display 111 (see FIG. 4). A capacity line 2408 indicates the maximum graphic resources available to application 104. Where bars 2404 rise above capacity line 2408, graphic resource utilization for associated frames of application 104 exceed the available graphic resources of mobile device 114; thus application 104 may 'capout' or crash when playing those frames. Display 2400 illustrates graphic resource utilization by frames 223 of application 104 in profile window 110, thereby facilitating assessment of graphic stresses applied to mobile device 114 when playing application 104. Where the number of frames 223 of application 104 exceeds the display capacity of display 2400, a scroll bar 2412 allows the user to scroll through bars 2404 for application 104.

Figure 25:
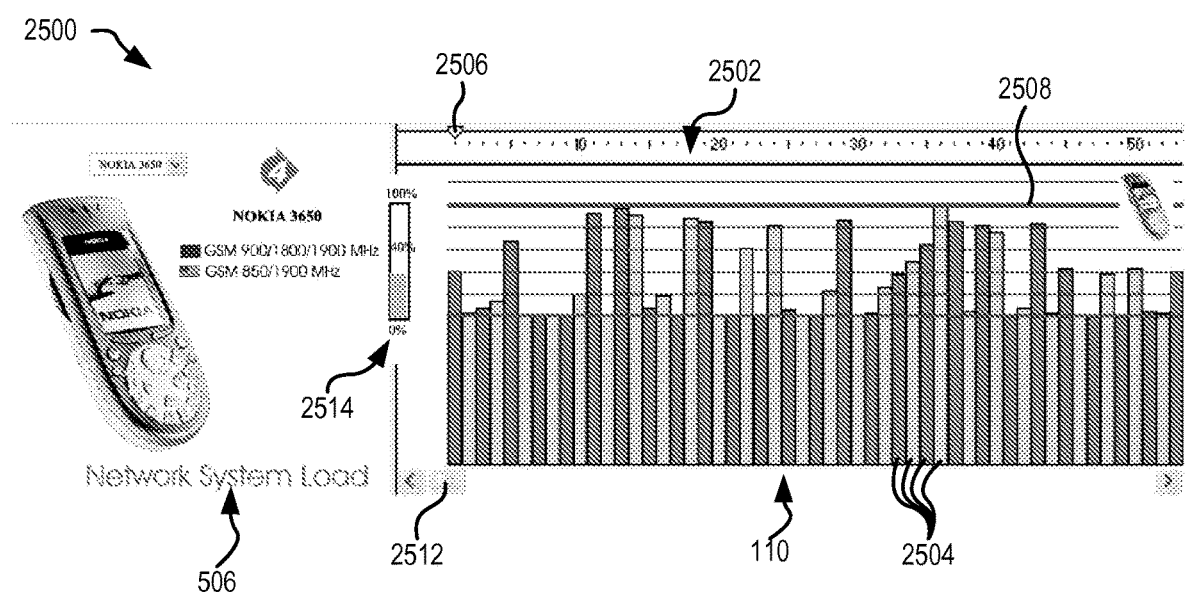
FIG. 25 shows an exemplary display illustrating profiled data for network resource utilization.

FIG. 25 shows one exemplary display 2500 illustrating a frame based display of profiled data 152 for network resource utilization as determined by system profile module 208. In particular, display 2500 is shown with a time line 2502 that represents timeline 222 of application 104. In this example, each bar 2504 indicates network resource utilization for certain frames 223 of application 104. During play of application 104 within model 102, a current position indicator 2506 shows the frame (i.e., frame 1 in this example) currently displayed by emulated mobile device display 111 (see FIG. 4). A capacity line 2508 indicates the maximum network resources available to application 104. Where bars 2504 rise above capacity line 2508, network resource utilization for associated frames of application 104 exceed the available network resources of mobile device 114; thus application 104 may 'capout' or crash when playing those frames. Display 2500 illustrates network resource utilization by frames 223 of application 104, thereby facilitating assessment of network stresses applied to mobile device 114 when playing application 104. Where the number of frames 223 of application 104 exceeds the display capacity of display 2500, a scroll bar 2512 allows the user to scroll through bars 2504 for application 104.

Figure 26:
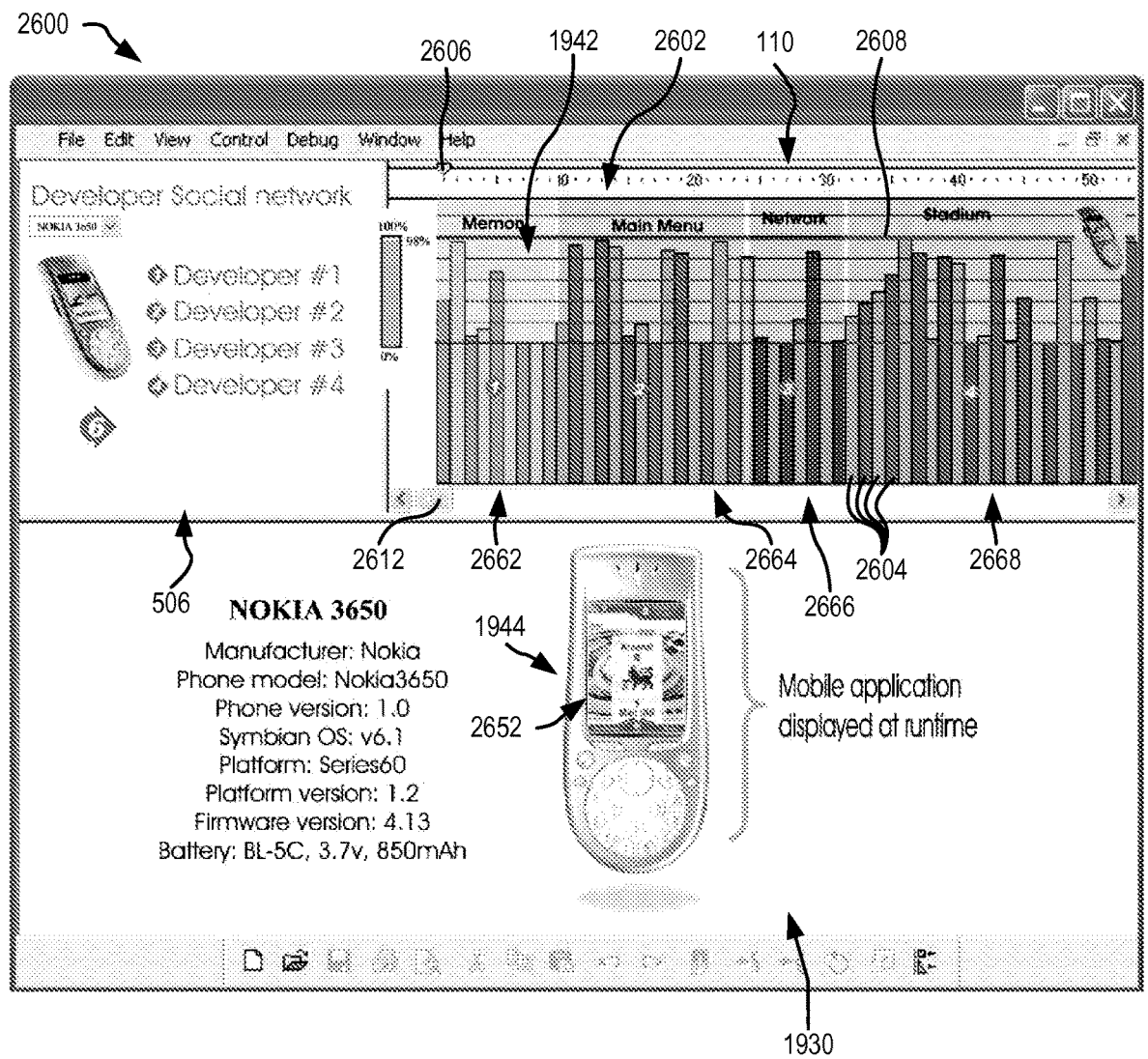
FIG. 26 shows an exemplary screen illustrating profiled data for total system resource utilization.

FIG. 26 shows one exemplary screen 2600 illustrating a frame based display of profiled data 1942, FIG. 20, for total system resource utilization as determined by one or more profilers within emulator 1922. In particular, screen 2600 is shown with a time line 2602 that represent a timeline of application 1906. In this example, each bar 2604 indicates total resource utilization for certain frames of application 1906. During play of application 1906 within emulator 1922, a current position indicator 2606 shows the frame (i.e., frame 1 in this example) currently displayed by emulated mobile device display 2652. A capacity line 2608 indicates the maximum total resources available to application 1906. Where bars 2604 rise above capacity line 2608, total resource utilization for associated frames of application 1906 exceed the available total resources of mobile device 114; thus application 1906 may 'capout' or crash when playing those frames. Display 2600 illustrates total resource utilization by frames of application 1906, thereby facilitating assessment of total stresses applied to mobile device 114 when playing application 1906. Where the number of frames of application 1906 exceeds the display capacity of display 2600, a scroll bar 2612 allows the user to scroll through bars 2604 for application 1906.

Screen 2600 may be simultaneously viewed within viewer 1930 of one or more authoring environments 1902. For example, where application 1906 is developed by two or more cooperating developers using authoring environments 1902, each authoring environment 1902 may display screen 2600 to show profile data 1942 and device view 1944 within viewer 1930 through operation of para-monitor 1908. In the example of FIG. 26, the application is developed by four cooperating developers (1-4), each developing one of four parts 2662, 2664, 2666, and 2668, respectively, of the application. For example, developer #1 may be working on a first part of the application, while developer #2 is working on a second part and developer #3 is working on a third part of the application.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A non-transitory, computer-readable medium comprising software instructions for developing an application to be run on a mobile device, wherein the software instructions, when executed, cause a computer to:
    display a list of one or more mobile device types from which a user can select;
    simulate one or more characteristics of a selected mobile device type;
    initiate loading of at least one of the selected characteristics from at least one of a remote server and a computer-readable media;
    monitor utilization of one or more resources of the selected mobile device type over time as an application is running;
    display a representation of one or more of the monitored resources.

2. The medium of claim 1, wherein the software instructions include identifying one or more areas of code, or functions, or both of the application responsible for utilization of a specific displayed resource at a given time.

3. The medium of claim 1, wherein the one or more characteristics include at least one of a processor type, processor speed, storage access speed, RAM size, storage size, display width, display height, pixel depth, processor availability, RAM availability or storage availability.

4. The medium of claim 1, wherein the monitored resources include processor usage and RAM usage.

5. The medium of claim 1, wherein the instructions initiate transmission of the application that is being developed to one or more physical versions of a mobile device corresponding to the selected mobile device type.

6. The medium of claim 5, wherein the instructions display simultaneously two or more representations of the monitored resource.

7. The medium of claim 1, wherein the instructions simulate one or more characteristics, including bandwidth, indicative of a network on which the selected mobile device type can operate.

8. The medium of claim 7, wherein the one or more characteristics are derived at least in part from information captured from one or more wireless networks.

9. The medium of claim 8, wherein the information captured from one or more wireless networks are stored in at least one of a file, a database, and on computer-readable media that is accessible via the internet.

10. The medium of claim 7, wherein the one or more characteristics are at least partially based on a geographical region.

11. The medium of claim 7, wherein the instructions are capable of simulating one or more network events that occur when interacting with a wireless network.

12. The medium of claim 11, wherein scripts can be created to simulate events that occur on a selected mobile device type to determine the performance of the application, or the network, or both.

13. The medium of claim 1, wherein the one or more characteristics are available for testing the application within one or more mobile devices connected to at least one of the internet and a wireless network.

14. The medium of claim 13, wherein the one or more mobile devices connected to the at least one of the internet and a wireless network enable a user to interact with and test the application on one or more mobile devices.

15. A non-transitory, computer-readable medium comprising software instructions for developing an application to be run on a mobile device, wherein the software instructions, when executed, cause a computer to:
    select one or more characteristics associated with a mobile device;
    monitor utilization of one or more resources of the mobile device over time by an application running on a simulation of the mobile device;
    display a representation of one or more of the monitored resource;

correspond the utilization of a specific displayed resource at a given time with one or more functions, or code, or both of the application responsible for that utilization;

initiate transmission of the application on a simulation of the mobile device, or to the physical mobile device, or both.

16. The medium of claim 15, wherein the instructions initiate loading of at least one of the one or more characteristics from at least one of a remote server and a computer-readable media, wherein the physical mobile device is connected to at least one of the internet, a wireless network and the remote server, to enable a user to interact with and test the application.

17. The medium of claim 15, wherein the software instructions include identifying one or more areas of code, or functions, or both of the application responsible for utilization of a specific displayed resource at a given time.

18. The medium of claim 15, wherein the characteristics include bandwidth information.

19. The medium of claim 18, wherein the instructions simulate one or more network events that occur when interacting with a wireless network.

20. The medium of claim 19, wherein scripts can be created to simulate events that occur on the mobile device to determine the performance of the application, or the network, or both.

21. The medium of claim 18, wherein the one or more characteristics are derived at least in part from information captured from one or more wireless networks.

22. The medium of claim 21, wherein the information captured from one or more wireless networks are stored in at least one of a file, a database, and on computer-readable media that is accessible via the internet.

23. The medium of claim 18, wherein the one or more characteristics are based on a geographical region.

24. The medium of claim 23, wherein the one or more geographical characteristics indicative of a network are stored in at least one of a file, a database, and on computer-readable media that is accessible via the internet.

25. The medium of claim 18, wherein the network characteristics are displayed using at least one of a map, drop-down list, and drop-down menu.

26. The medium of claim 18, wherein the network characteristics can be managed or custom network characteristics can be created.

27. The medium of claim 18, wherein the instructions display simultaneously two or more representations of the monitored resource.

28. The medium of claim 27, wherein the instructions to display the representations are stored in at least one of a file, a database, and on computer-readable media that is accessible via the internet.

29. The medium of claim 15, wherein at least one of the one or more characteristics are stored on at least one of a file, a database and on a computer-readable media that is accessible via the internet.

30. The medium of claim 15, wherein the instructions include a set of declared resources for the application.

31. The medium of claim 30, wherein the declared resources include information to evaluate performance of at least one of the application or a network.

32. The medium of claim 31, wherein the event performance measurement can be used to evaluate performance of the application, or the network, or both.

33. The medium of claim 15, wherein the instructions allow scripts to be created that simulate actions capable of being performed by the mobile device.

34. The medium of claim 33, wherein the scripts can be modified or recorded.

35. The medium of claim 34, wherein the scripts include an event generator to determine resource utilization of at least one of the application and the network.

36. The medium of claim 35, wherein the event generator can be used to evaluate performance of at least one of the application and the network.

* * * * *